United States Patent
Tanaka

(10) Patent No.: US 11,495,458 B2
(45) Date of Patent: Nov. 8, 2022

(54) MANUFACTURING METHOD AND SEMICONDUCTOR ELEMENT

(71) Applicant: NEC Corporation, Tokyo (JP)

(72) Inventor: Tomo Tanaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/143,575

(22) Filed: Jan. 7, 2021

(65) Prior Publication Data

US 2021/0217851 A1 Jul. 15, 2021

(30) Foreign Application Priority Data

Jan. 15, 2020 (JP) .............................. JP2020-004137

(51) Int. Cl.
| | |
|---|---|
| *H01L 21/02* | (2006.01) |
| *H01L 29/16* | (2006.01) |
| *H01L 31/0352* | (2006.01) |
| *H01L 27/146* | (2006.01) |
| *H01L 31/18* | (2006.01) |
| *H01L 29/04* | (2006.01) |

(52) U.S. Cl.
CPC ...... *H01L 21/02527* (2013.01); *H01L 27/146* (2013.01); *H01L 29/045* (2013.01); *H01L 29/1606* (2013.01); *H01L 31/035272* (2013.01); *H01L 31/18* (2013.01)

(58) Field of Classification Search
CPC ........... H01L 29/1606; H01L 29/66015; H01L 21/0331; H01L 21/0332; H01L 21/0334; H01L 21/0335; H01L 21/0337; H01L 21/7806; H01L 21/02527; H01L 27/146; H01L 29/045; H01L 31/035272; H01L 31/18

See application file for complete search history.

(56) References Cited

U.S. PATENT DOCUMENTS

| | | | | |
|---|---|---|---|---|
| 9,991,113 | B2 * | 6/2018 | Kim | H01L 21/02645 |
| 2010/0320445 | A1 * | 12/2010 | Ogihara | H01L 29/2003 977/734 |
| 2013/0189444 | A1 * | 7/2013 | Kub | B82Y 30/00 427/523 |
| 2014/0217356 | A1 * | 8/2014 | Bayram | H01L 33/14 257/13 |
| 2017/0194476 | A1 * | 7/2017 | Brueck | H01L 21/02494 |
| 2019/0035624 | A1 * | 1/2019 | Snure | H01L 21/02485 |

FOREIGN PATENT DOCUMENTS

| | | |
|---|---|---|
| JP | 2005-353996 A | 12/2005 |
| JP | 2015-012075 A | 1/2015 |

* cited by examiner

*Primary Examiner* — Eduardo A Rodela
(74) *Attorney, Agent, or Firm* — Sughrue Mion, PLLC

(57) ABSTRACT

In order to enable simple removal of a substrate used for manufacturing a semiconductor element, a manufacturing method includes forming a graphene layer on a substrate portion formed of a semiconductor, forming an element portion on the graphene layer, the element portion including a semiconductor layer directly formed on the graphene layer, which takes over crystal information relating to the substrate portion when the semiconductor layer is formed on the substrate portion without intermediation of the graphene layer, and performing cutting-off between the substrate portion and the element portion at the graphene layer.

14 Claims, 32 Drawing Sheets

MANUFACTURING METHOD AND SEMICONDUCTOR ELEMENT

This application is based upon and claims the benefit of priority from Japanese Patent Application No. 2020-004137, filed on Jan. 15, 2020, the disclosure of which is incorporated herein in its entirety by reference.

TECHNICAL FIELD

The present invention relates to a semiconductor element and a manufacturing method thereof.

BACKGROUND ART

In recent years, demands for high integration, size reduction, and high performance of electronic devices have been increased. In order to achieve those demands, there has been widely used a hybrid type semiconductor element employing flip-chip connection in which a semiconductor substrate is connected to another semiconductor substrate through intermediation of bump electrodes.

As one example of such a hybrid type semiconductor element, PTL 1 discloses a hybrid type image sensor in which a light receiving portion and a circuit board are joined to each other. The hybrid type image sensor employs a structure in which the light receiving portion and the circuit board are joined to each other through use of indium (In) bumps and then a gap between the light receiving portion and the circuit board is filled with underfills in order to enhance reliability of the joint.

Such a hybrid type semiconductor element often employs a method of causing light to enter a surface facing the circuit board as seen from the light receiving portion. In this case, a semiconductor substrate used at a time of forming the light receiving portion is present. The semiconductor substrate causes incident light to attenuate, which may degrade detection sensitivity. Thus, removal of the semiconductor substrate is important for improvement in element performance.

FIG. 1 is a schematic diagram illustrating a manufacturing method of a hybrid type semiconductor element, the method including removal of the semiconductor substrate described above.

When operations in FIG. 1 are started, an operator or the like first prepares a substrate portion as an operation of A101. Herein, an operator or the like is an operator or a machine including a manufacturing robot for manufacturing a semiconductor element. Further, the substrate portion is a semiconductor substrate or a semiconductor substrate having a semiconductor layer formed thereon as needed. The substrate portion is a portion being a substrate for causing a function layer, which is formed on the substrate portion, to be crystal-grown. Herein, the function layer is a main structure portion that contributes to light emission in a case where the hybrid type semiconductor layer is a light emitting element. The substrate portion is relevant to the above-mentioned semiconductor substrate to be removed.

Subsequently, as an operation of A102, an operator or the like generates an element portion, which is acquired by patterning the above-mentioned function layer as need, on the substrate portion prepared in the operation of A101.

Meanwhile, as an operation of A103, an operator or the like forms a second substrate portion. The second substrate portion is formed by forming the bumps and the underfills described above on a predetermined substrate and flattening a surface.

Then, as an operation of A104, an operator joins the uppermost part of the element portion, which is formed on the first substrate in the operation of A102, to the uppermost part of the second substrate portion, which is formed in the operation of A103. With this joint, each of the bumps is joined to the element portion.

Then, as an operation of A105, an operator or the like removes the substrate portion, and completes the operations in FIG. 1.

Herein, as the method of removing a substrate relevant to the above-mentioned substrate portion, a method of performing mechanical polishing (see PTL 2) and a chemical method using an etching solution (see PTL 2) are known.

[PTL 1] Japanese Unexamined Patent Application Publication No. 2015-012075

[PTL 2] Japanese Unexamined Patent Application Publication No. 2005-353996

However, when mechanical polishing is used for removal of the substrate of the light receiving portion, a joint part of the light receiving portion and the element including the light receiving portion may be damaged. Further, when chemical etching is used, it requires time to remove the entire substrate. Thus, when chemical etching is used, mechanical polishing is required to be used in combination. Specifically, removal of the semiconductor substrate used for forming the light receiving portion generally has a problem of degradation in element yield due to mechanical damage and complicated processing requiring increased time for assembling.

SUMMARY

An object of the present invention is to provide a manufacturing method and the like that enable simple removal of a substrate used for manufacturing a semiconductor element.

A manufacturing method according to the present invention is a method for manufacturing a semiconductor element, including: forming a graphene layer on a substrate portion formed of a semiconductor; forming an element portion on the graphene layer, the element portion including a semiconductor layer directly formed on the graphene layer, which takes over crystal information relating to the substrate portion when the semiconductor layer is formed on the substrate portion without intermediation of the graphene layer; and performing cutting-off between the substrate portion and the element portion at the graphene layer.

The manufacturing method and the like according to the present invention enable simple removal of a substrate used for manufacturing the semiconductor element.

BRIEF DESCRIPTION OF THE DRAWINGS

Example features and advantages of the present invention will become apparent from the following detailed description when taken with the accompanying drawings in which.

EXAMPLE EMBODIMENT

Next, a detailed explanation will be given for a first example embodiment with reference to the drawings.

First Example Embodiment

The present example embodiment is an example embodiment relating to a semiconductor element, which is formed by, after forming the semiconductor element on a graphene layer formed on a semiconductor substrate, removing the semiconductor substrate by cutting off the semiconductor substrate from the graphene layer.

[Configuration and Operation]

Figure 2:
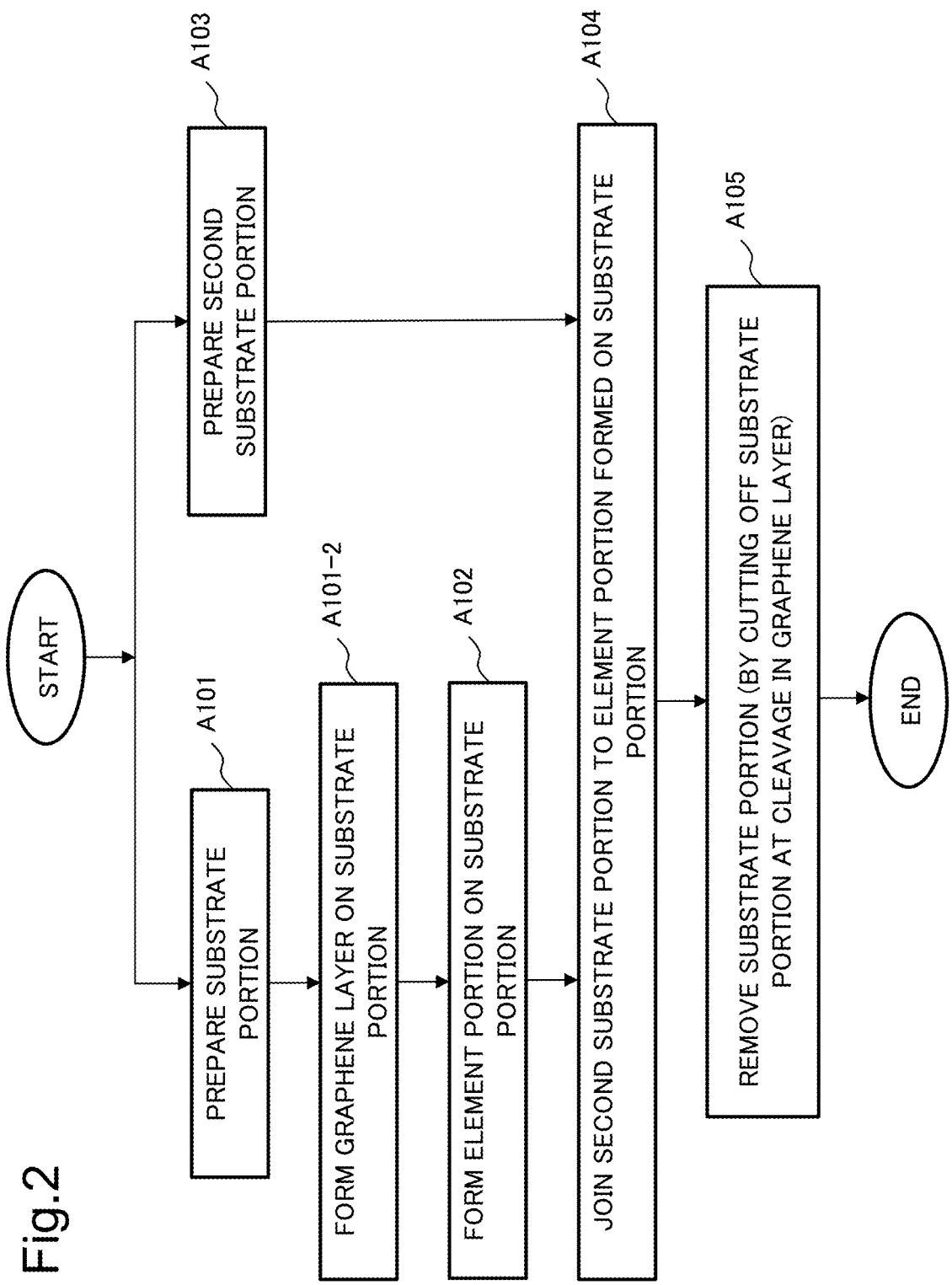
FIG. 2 is a schematic diagram illustrating a manufacturing method of a semiconductor element according to an example embodiment.

FIG. 2 is a schematic diagram illustrating a manufacturing method of a semiconductor element according to the present example embodiment.

Figure 1:
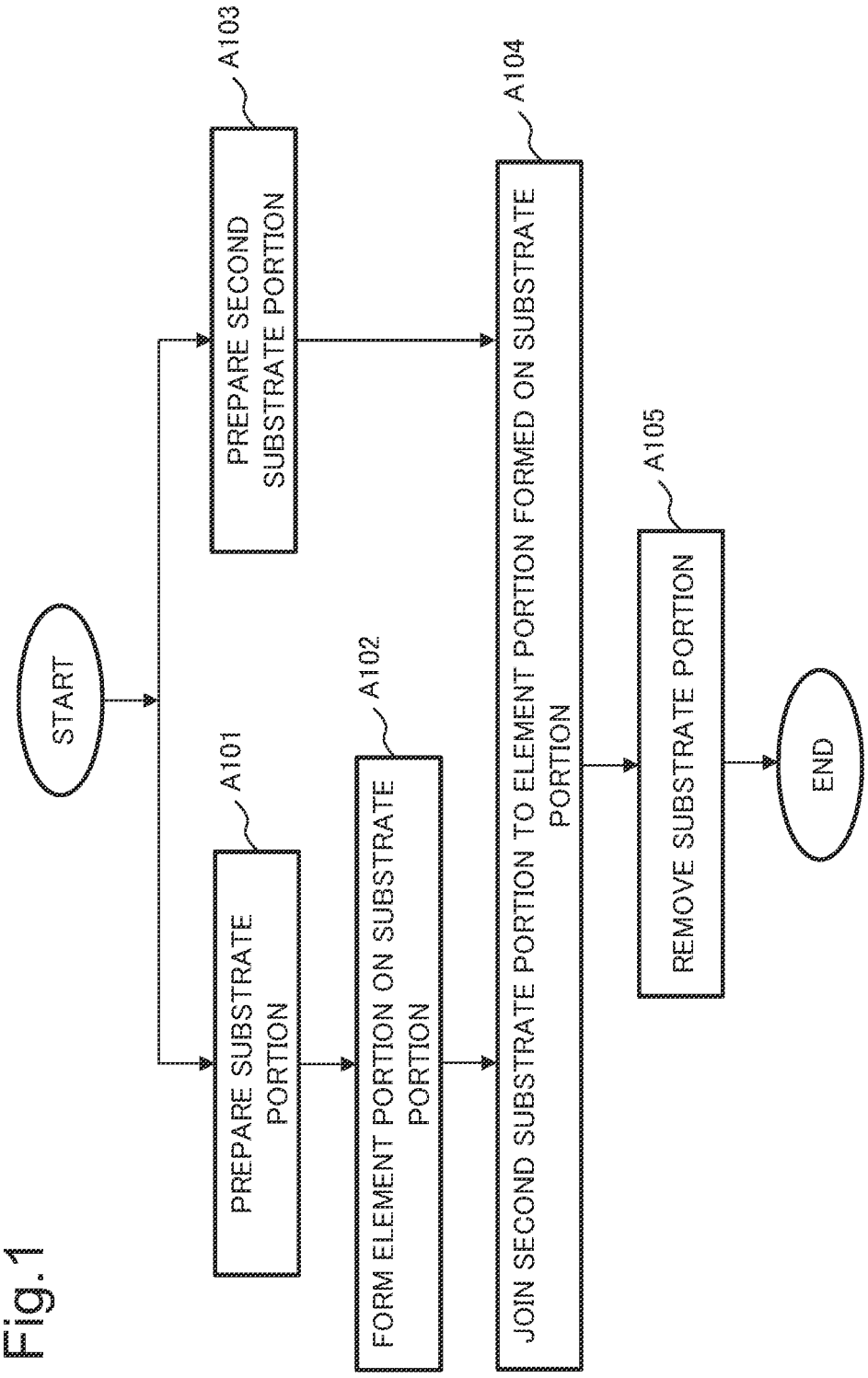
FIG. 1 is a schematic diagram illustrating a general manufacturing method of a semiconductor element.

When operations in FIG. 2 are started, an operator or the like first prepares a substrate portion as an operation of A101. Herein, an operator or the like is an operator or a machine including a manufacturing robot for manufacturing a semiconductor element. The operation of A101 is equivalent to the operation of A101 in FIG. 1. A specific example of preparation for the substrate portion is described later with reference to FIG. 3.

Subsequently, as an operation of A101-2, an operator or the like forms a graphene layer on the substrate portion prepared in the operation of A101. It is assumed that the graphene layer to be formed has a thickness substantially as thin as one atomic layer. A specific example of a forming method of the graphene layer is described later with reference to FIGS. 4 to 10.

Subsequently, as an operation of A102, an operator or the like forms an element portion on the graphene layer formed in the operation of A101-2. As described above, the thickness of the graphene layer is substantially as thin as one atomic layer, and hence the element portion is crystal-grown under a lattice matching state with the uppermost surface of the substrate portion. A specific example of a forming method of the element portion is described later with reference to FIG. 11.

Meanwhile, as an operation of A103, an operator or the like prepares a second substrate portion. The second substrate portion has a substrate-like shape used in processing in A104.

Further, as an operation of A104, an operator or the like joins the second substrate portion, which is prepared in the operation of A103, to the element portion formed on the substrate portion in the operation of A102. A specific example of the operation of A104 is described later with reference to FIG. 12.

Subsequently, as an operation of A105, an operator or the like removes the above-mentioned substrate portion by cutting off the substrate portion from the above-mentioned element portion at cleavage in the graphene layer. The graphene layer is soft, and hence is broken in such a way as to generate the cleavage before breaking the substrate portion and the element portion. A detailed example of the cutting-off is described later with reference to FIGS. 13 and 14.

Further, an operator or the like completes the operations in FIG. 2.

A specific example of each operation illustrated in FIG. 2 is described below with reference to the drawings.

Figure 3:
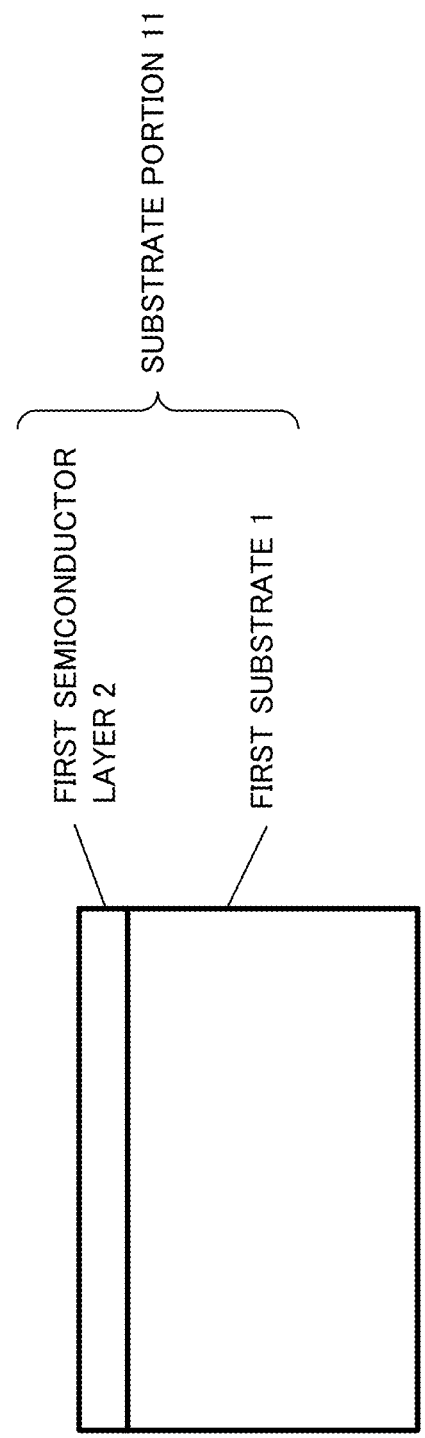
FIG. 3 is a schematic diagram illustrating a configuration example of a substrate portion.

First, with reference to FIG. 3, the specific example of the operation of A101 in FIG. 2 is described. FIG. 3 is a schematic diagram which illustrates a configuration of a substrate portion 11 being an example of the substrate portion illustrated in FIG. 2. The substrate portion 11 includes a first substrate 1 and a first semiconductor layer 2.

For example, the first substrate 1 is a GaAs substrate. When the operations in FIG. 2 are performed, an operator or the like first prepares the first substrate 1, and introduces the first substrate 1 to a crystal growth device. Further, an operator or the like raises a substrate temperature to a predetermined temperature while performing irradiation with an As molecular beam. With this, a natural oxide film formed on the first substrate 1 is removed.

After that, an operator or the like performs irradiation with a Ga molecular beam and an As molecular beam at a predetermine substrate temperature, and thus forms the first semiconductor layer 2 formed of GaAs having a predetermined thickness. The first semiconductor layer 2 needs only to have a thickness that is thick enough to eliminate an impact of a defect or the like present on the surface of the first substrate 1, and may be approximately 300 nm, for example, which is sufficient. When there is no impact of a surface defect or the like of the first substrate 1, the first semiconductor layer 2 may not be provided.

Figure 4:
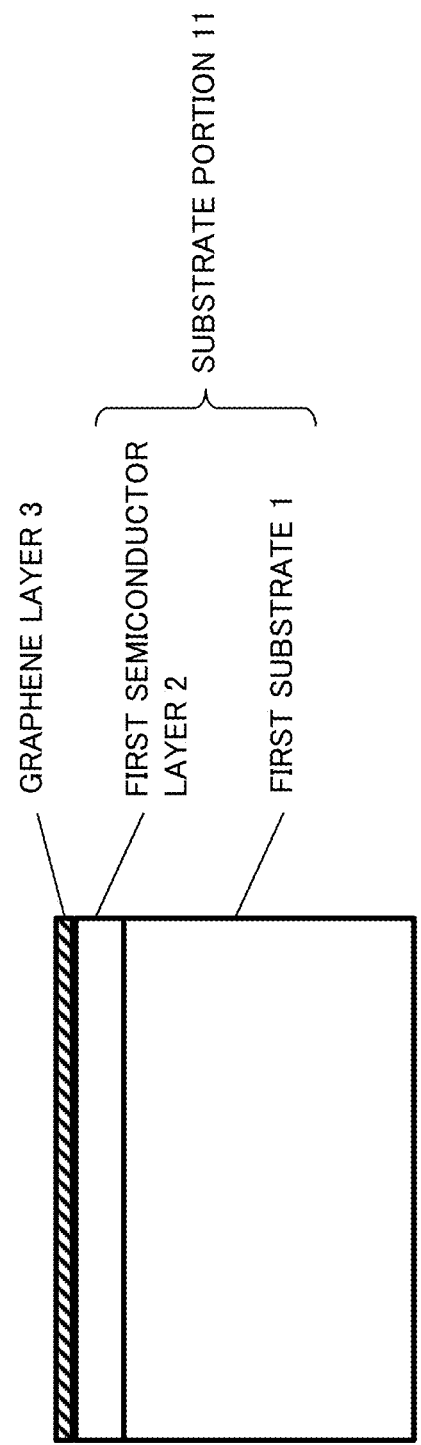
FIG. 4 is a schematic diagram illustrating a state in which a graphene layer is formed on the substrate portion.
Figure 5:
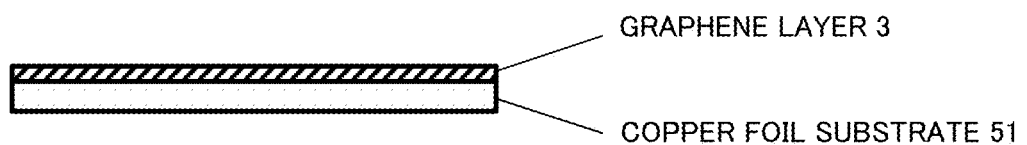
FIG. 5 is a schematic diagram illustrating the graphene layer formed on a copper foil substrate.
Figure 6:
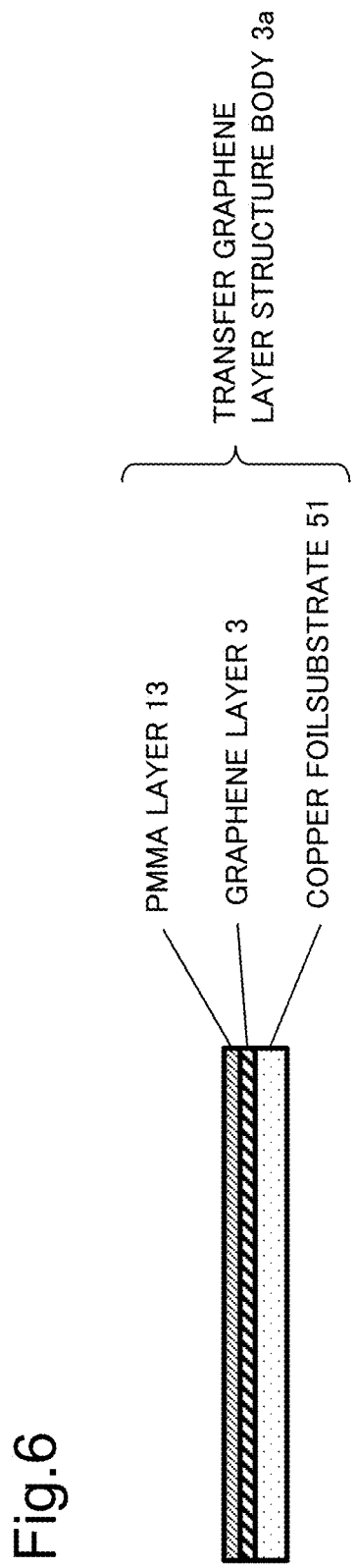
FIG. 6 is a schematic diagram illustrating a transfer graphene layer structure body on the copper foil substrate.

Subsequently, with reference to FIGS. 4 to 9, the specific example of the operation of A101-2 in FIG. 2 is described. FIG. 4 is a diagram illustrating a state in which a graphene layer 3 being an example of the graphene layer illustrated in FIG. 2 is formed on the substrate portion 11 in FIG. 3. The graphene layer 3 in FIG. 4 is formed as described below, for example.

When the operation of A101-2 is performed, an operator or the like first forms a transfer graphene layer structure body. In this case, first, formation of the graphene layer 3 is performed in a chemical vapor deposition (CVD) device. The CVD device is a device in which a raw material gas or the like is supplied on a heated test piece in a reaction tube formed of quartz or the like and a thin film is formed through a chemical reaction. For example, an operator or the like introduces, into the CVD device, a raw material gas (a gas containing C such as methane and ethylene in this case) and a carrier gas (H2, Ar, or the like) under a state in which the temperature of the substrate is controlled to be a predetermined temperature being a high temperature. Further, the gas causes a chemical reaction on the heated substrate in such a way as to accumulate carbon atoms, and thus an operator or the like forms a graphene layer.

In this case, for example, as pre-processing for the substrate, an operator or the like first heats a copper foil substrate 51 having a thickness of approximately 1 μm, which is separately prepared, at 1,000° C., and performs heat processing for 30 minutes under a state in which a hydrogen gas is introduced by 10 Standard Cubic Centimeter per Minute (sccm). Subsequently, an operator or the like maintains a state for 30 minutes in which the substrate temperature is maintained at 1,000° C. and a pressure of a reactor is maintained at 2.0 Torr, the reactor to which a methane gas (CH4) is introduced by 4 sccm and a hydrogen gas (H2) is introduced by 70 sccm, and an operator or the like forms the graphene layer 3. With this processing, the graphene layer 3 at a monoatomic layer level is formed on the copper foil substrate 51 as in FIG. 5.

Subsequently, an operator or the like takes out the copper foil substrate 51 having the graphene layer 3 formed thereon from the CVD device, and forms a polymethyl methacrylate (PMMA) thin film on the graphene layer 3 by spin coating. After that, an operator or the like subjects the copper foil substrate 51 to heat processing in nitrogen atmosphere at 80° C. for 30 minutes. With this, as in FIG. 6, a transfer graphene layer structure body 3a having a three-layer structure including the copper foil substrate 51, the graphene layer 3, and a PMMA layer 13 is achieved.

Figure 7:
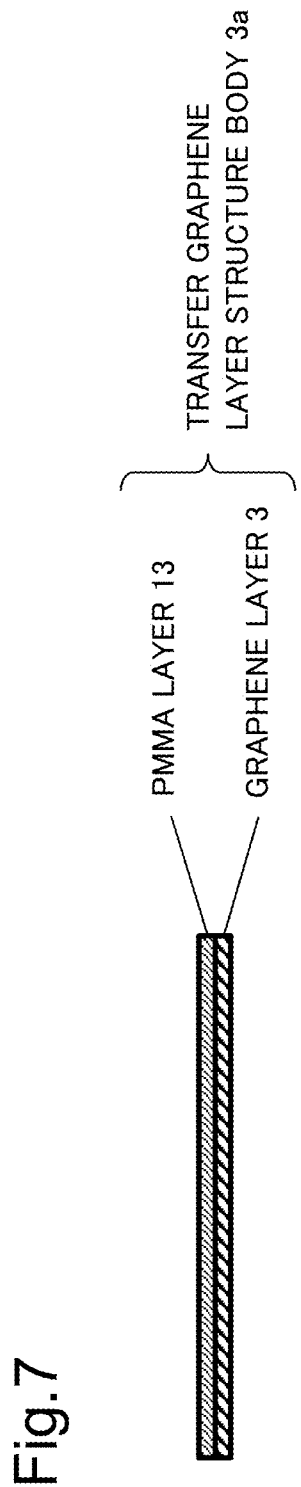
FIG. 7 is a schematic diagram illustrating the transfer graphene layer structure body from which the copper foil substrate is removed.
Figure 8:
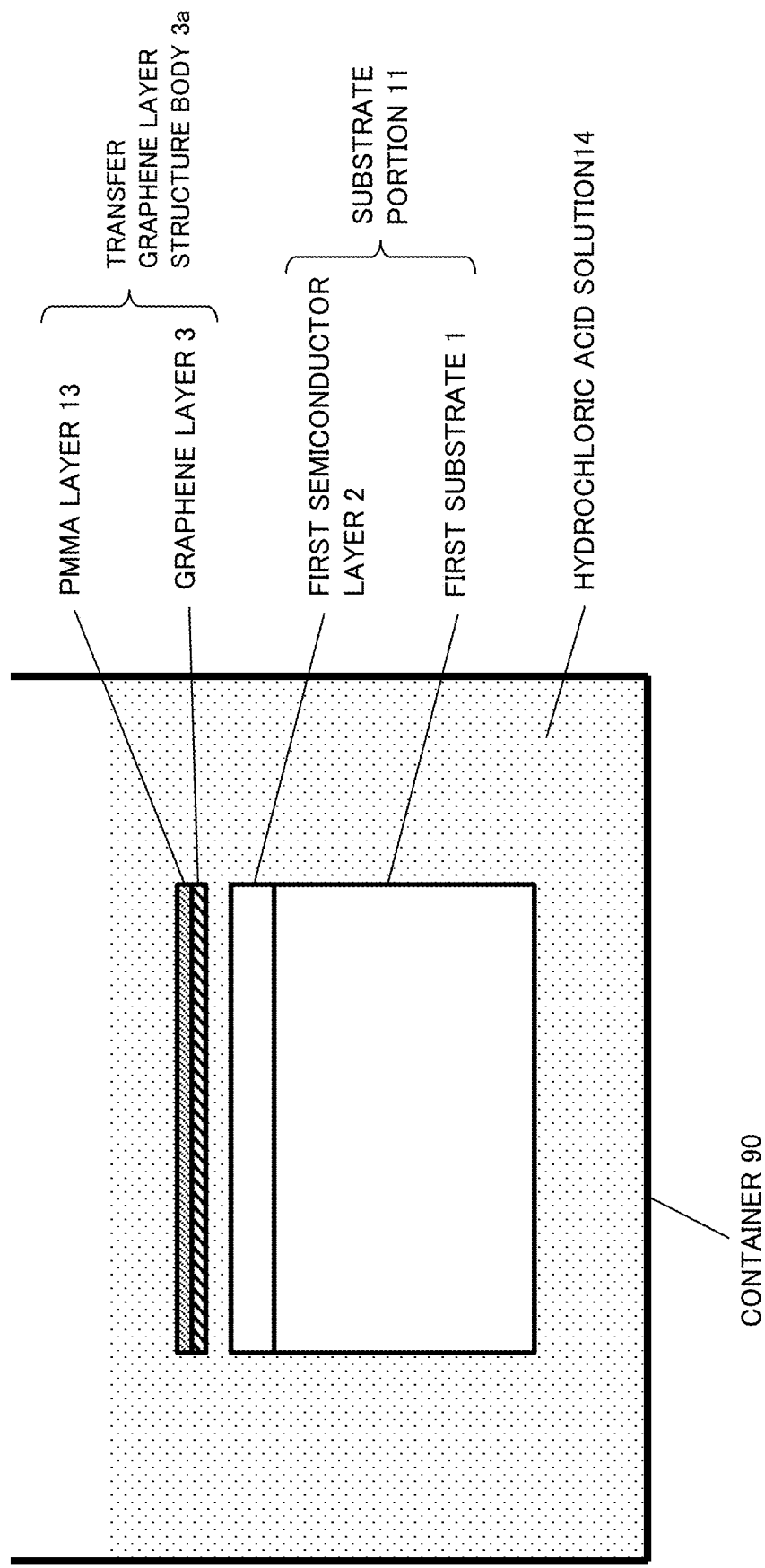
FIG. 8 is a schematic diagram illustrating a state in which the transfer graphene layer structure body is transferred onto the substrate portion.
Figure 9:
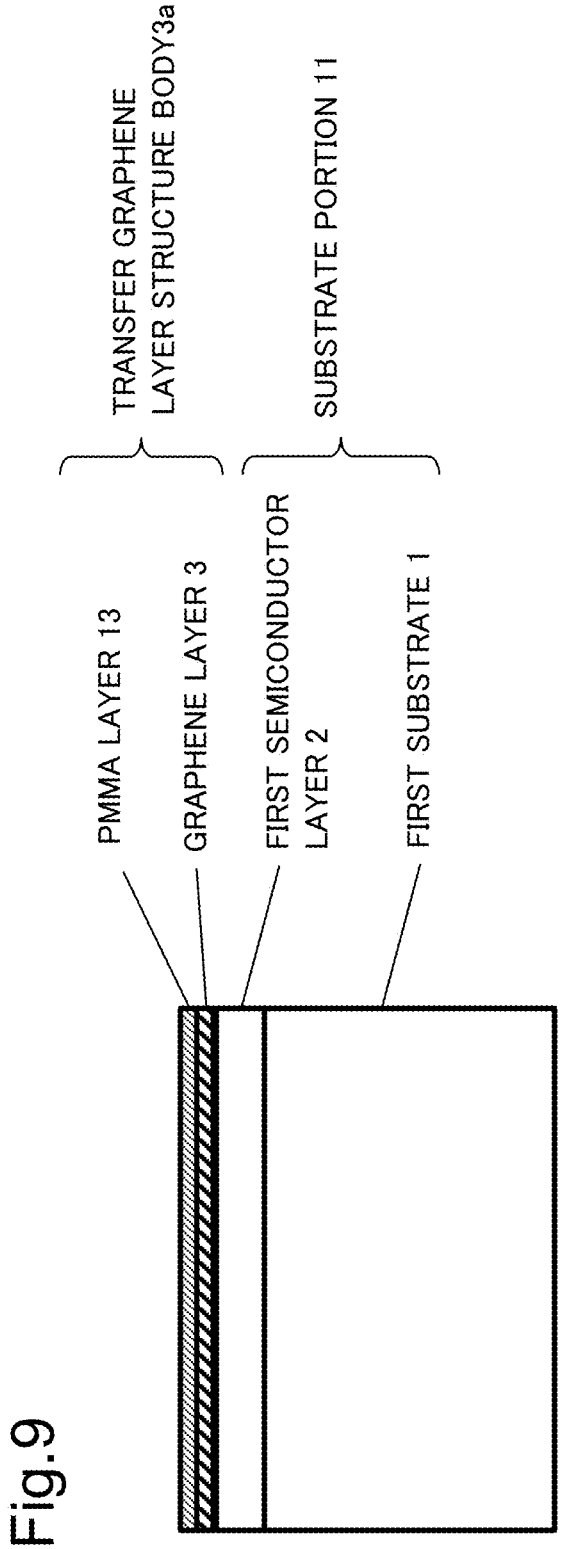
FIG. 9 is a schematic diagram illustrating the transfer graphene layer structure body transferred onto the substrate portion.

Subsequently, an operator or the like immerses the transfer graphene layer structure body 3a in a ferric chloride solution, and removes the copper foil substrate 51. As a result, the transfer graphene layer structure body 3a has a structure including only the graphene layer 3 and the PMMA layer 13 as illustrated in FIG. 7. Further, an operator or the like takes out the first substrate 1, which has an upper part having the first semiconductor layer 2 formed thereon, from the crystal growth device. Further, as in FIG. 8, an operator or the like sets a growth surface facing upward in a hydrochloric acid solution 14 in a container 90, and immerses the transfer graphene layer structure body 3a in FIG. 7 on the growth surface at a position adjusted in such a way to cover the substrate in the solution under a state in which the graphene layer 3 is present on a lower side. With this, the transfer graphene layer structure body 3a sinks due to the gravity, and the transfer graphene layer structure body 3a is transferred and fixed under a state in which the graphene layer 3 is on the first semiconductor layer 2 having a surface from which a natural oxide film is removed due to hydrochloric acid. After that, an operator or the like takes out the first substrate 1 onto which the transfer graphene layer structure body 3a is transferred, and immerses the first substrate 1 in acetone. With this, the configuration in FIG. 4 in which the graphene layer 3 is transferred onto the substrate portion 11 is formed.

Figure 10:
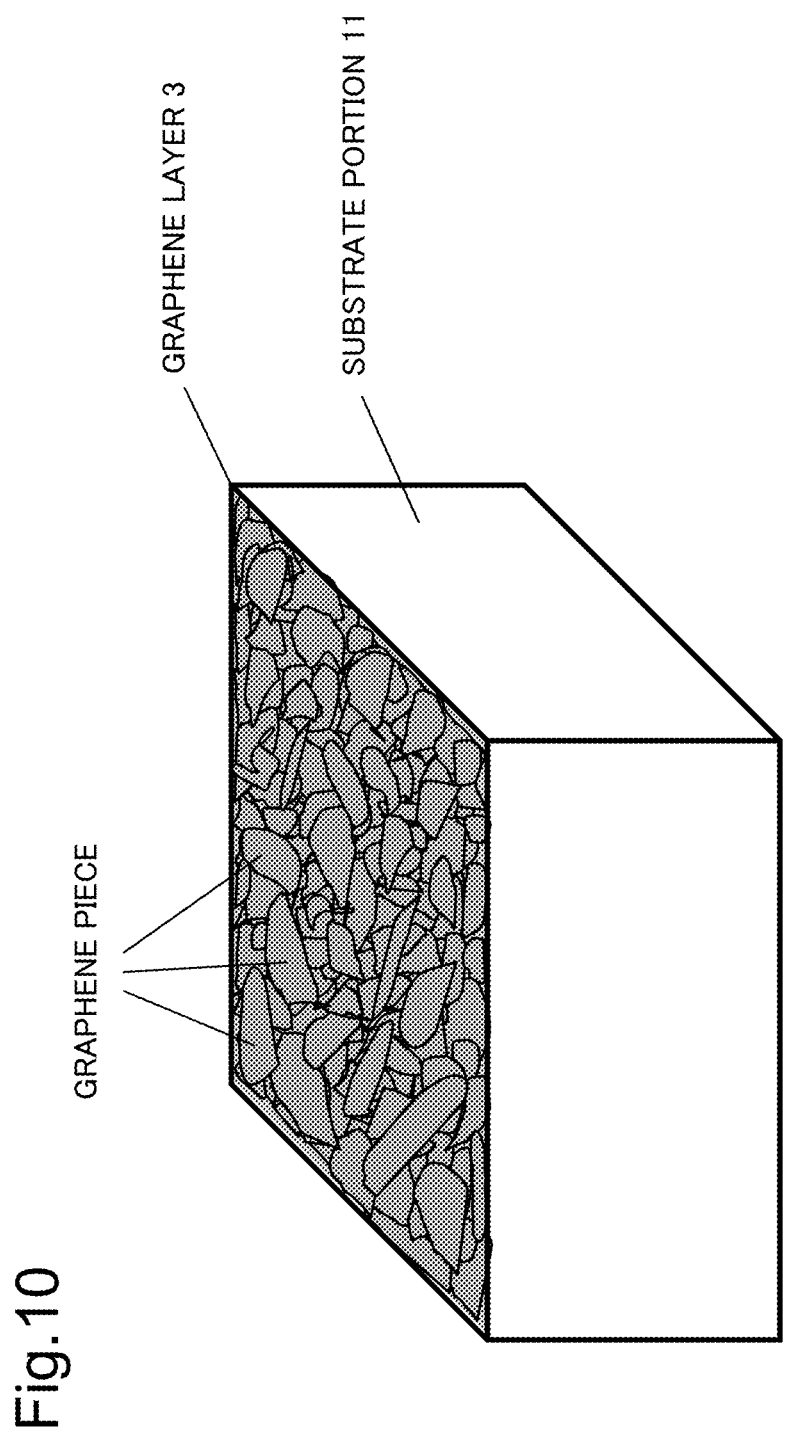
FIG. 10 is a schematic diagram illustrating the graphene layer on the substrate portion.

A number of graphene pieces are formed in the graphene layer 3 having the configuration in FIG. 4, which is thus formed, as illustrated in FIG. 10. Closed figures illustrated in the graphene layer 3 in FIG. 10 are the graphene pieces.

The method of forming the graphene layer 3 on the first semiconductor layer 2 is described above, but this is merely an example. An operator or the like may use other materials and methods that satisfy requirements when forming the graphene layer 3. Further, for example, an operator or the like may form the graphene layer 3 by irradiating the substrate with a substance containing carbon through use of molecular beam epitaxy, organic metal heat decomposition, or the like. Moreover, an operator or the like may form the graphene layer 3 being a thin film formed of carbon by, after forming a thin film formed of a chemical compound such as SiC containing carbon, decomposing and sublimating a substance other than carbon.

Figure 11:
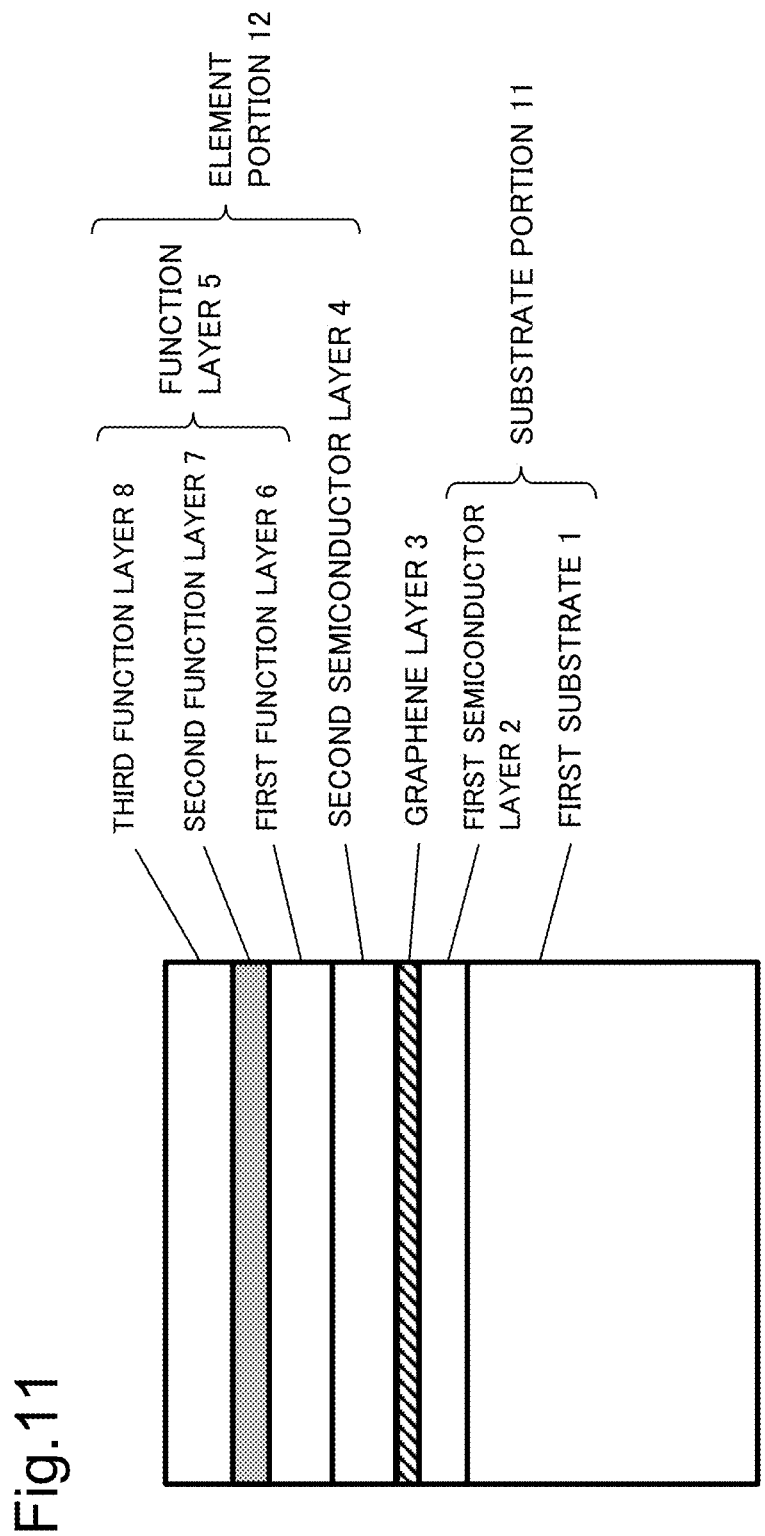
FIG. 11 is a schematic diagram illustrating an element portion formed on the graphene layer.

Next, with reference to FIG. 11, the specific example of the operation of A102 in FIG. 2 is described. In the configuration in FIG. 11, a second semiconductor layer 4, a first function layer 6, a second function layer 7, and a third function layer 8 are further formed on the graphene layer 3 having the configuration in FIG. 4. Herein, a laminated body including the first function layer 6, the second function layer 7, and the third function layer 8 is a function layer 5 being an example of the function layer described in the section of Background Art. The configuration in FIG. 11 is formed as described below.

When the operation of A102 in FIG. 2 is performed, an operator or the like first forms the second semiconductor layer 4 on the substrate portion 11 in which the graphene layer 3 is formed on the first semiconductor layer 2, as in FIG. 4. For this, an operator or the like re-introduces the configuration in FIG. 4 in the crystal growth device. Further, an operator or the like causes the second semiconductor layer 4 to be grown on the graphene layer 3. In this case, the graphene layer 3 has a film thickness at a monoatomic layer level, and hence information relating to a crystal lattice of the first semiconductor layer 2 is propagated to the second semiconductor layer 4. Herein, for example, the information relating to a crystal lattice is a lattice constant of the crystal lattice, crystal orientation of the crystal lattice, and surface orientation of a crystal surface. Thus, the second semiconductor layer 4 having the same lattice constant and the crystal orientation as the first semiconductor layer 2 is crystal-grown on the graphene layer 3. For example, the second semiconductor layer 4 is GaAs that is the same as the first semiconductor layer 2.

For formation of the second semiconductor layer 4, for example, an operator or the like first subjects the configuration in FIG. 4 to heat processing in vacuum atmosphere at 300° C. for 30 minutes in an introduction chamber of the crystal growth device. After that, an operator or the like introduces the configuration in FIG. 4 to a growth chamber, and causes growth of GaAs. For example, an operator or the like performs the crystal growth by a two-step growth method in which a growth temperature is changed at two steps including a low temperature and a high temperature. Subsequently, an operator or the like raises the substrate temperature to 350° C. while performing irradiation with an As molecular beam and subsequently performing irradiation with a Ga molecular beam together with an As molecular beam, and thus forms the second semiconductor layer 4 formed of GaAs having a predetermined thickness. After that, an operator or the like raises the substrate temperature to 500° C., maintains the temperature for 20 minutes, and performs heat processing. With this processing, the second semiconductor layer 4 formed of GaAs having high quality is formed.

The growth temperature of the second semiconductor layer 4 is not limited to those temperatures as long as the temperature enables a GaAs growth core to be formed at a low temperature and improves crystallinity at a high temperature. The growth method is not limited to the two-step growth method of changing the temperature at two steps. For example, an operator or the like may first perform irradiation with a Ga molecular beam, supply only Ga at a low temperature, form droplets formed of Ga, and then form GaAs crystals by gradually raising the substrate temperature while performing irradiation with an As molecular beam, which is called droplet epitaxy. Moreover, an operator or the like may perform formation of the second semiconductor layer 4 in a plurality of divided times. For example, an operator or the like may first form a thin semiconductor layer by the two-step growth method, and then form the second semiconductor layer 4 having a predetermined thickness by forming a semiconductor layer with excellent crystallinity at a high temperature.

The thickness of the second semiconductor layer 4 is equivalent to a thickness of the semiconductor layer left on a side of the function layer 5 when the function layer 5 is separated from the first substrate 1, and the thickness is determined appropriately depending on a device to be manufactured. In general, the thickness of the second semiconductor layer 4 is approximately several micrometers.

Subsequently, an operator or the like forms the function layer 5 on the second semiconductor layer 4. The function layer 5 depends on a device to be manufactured, but an example in which a double hetero structure being a basic structure of an optical semiconductor device is manufactured is given in the following description. The function layer 5 is a laminated body including the first function layer 6, the second function layer 7, and the third function layer 8. Herein, for example, it is assumed that an operator or the like forms the first function layer 6 from AlGaAs, the second function layer 7 from GaAs, and the third function layer 8 from AlGaAs. For example, an operator or the like forms the first function layer 6, the second function layer 7, and the third function layer 8 by performing irradiation with only a Ga molecular beam or an Al molecular beam and a Ga molecular beam while performing irradiation with an As molecular beam.

Note that, in the description given above, the example of using GaAs as the first substrate 1, GaAs as the first semiconductor layer 2 and the second semiconductor layer 4, and the double hetero structure being a basic structure of a light receiving optical semiconductor device as the function layer 5 is given as one example. However, those merely illustrate an example of the basic configuration, and are not limited thereto. Further, formation of each semiconductor layer can be performed by a crystal growth method such as molecular beam epitaxy, organic metal heat decomposition, and a liquid layer growth method. The example of using molecular beam epitaxy is given as described above, but is not limited thereto.

Figure 12:
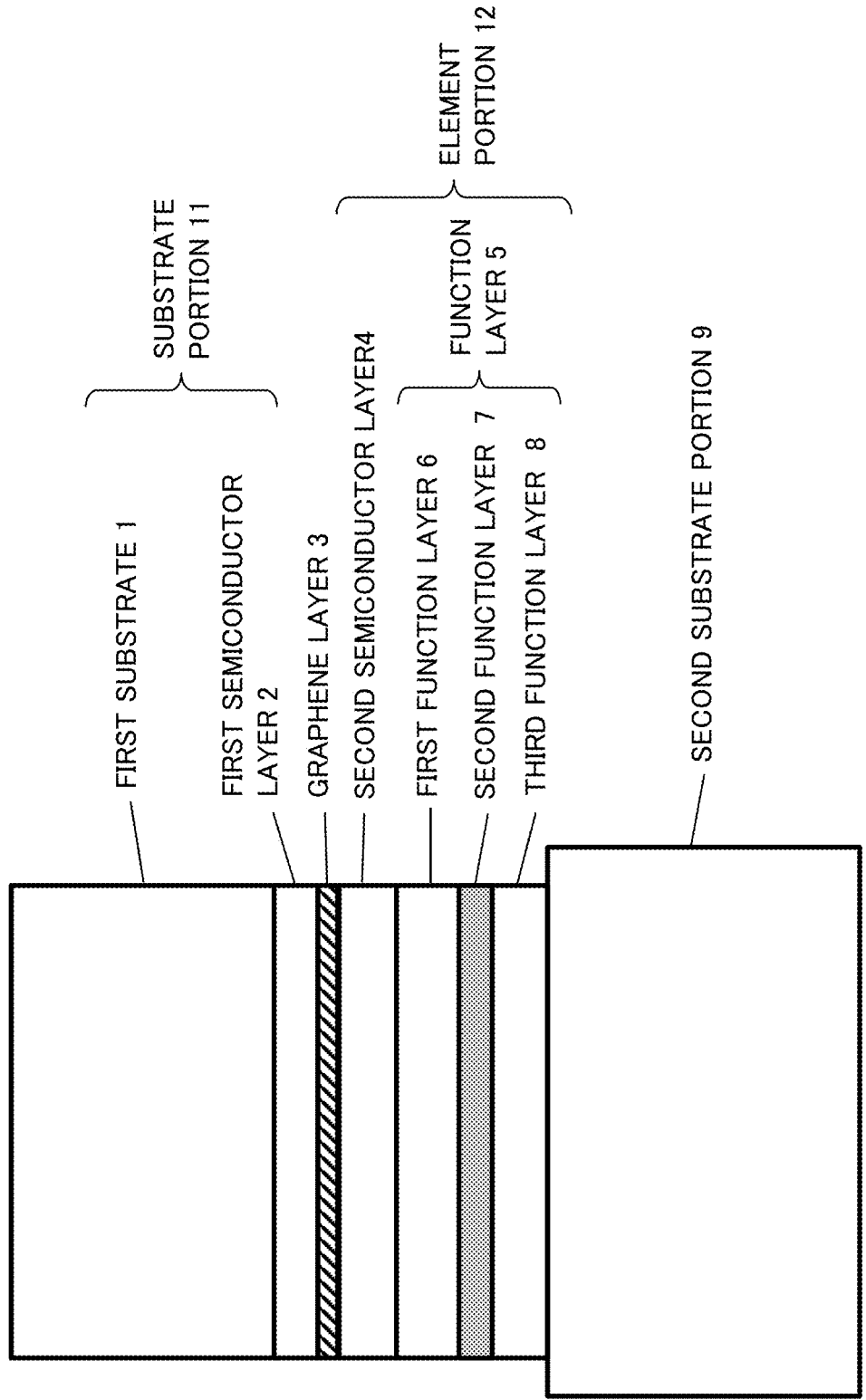
FIG. 12 is a schematic diagram illustrating a state in which the second substrate is joined to the element portion.

Next, with reference to FIG. 12, the specific example of the operation of A104 in FIG. 2 is described. In FIG. 12, a second substrate portion 9 is set in such a way as to be held in contact with the third function layer 8 of the configuration in FIG. 11.

When the operation of A104 is performed, an operator or the like takes out the configuration in FIG. 11, which completes the growth, from the crystal growth device, and fixes the configuration, which is turned upside down, on the second substrate portion 9. The material of the second substrate portion 9 is not particularly limited as long as a test piece can be fixed, and a silicon substrate may be used, for example. When the second substrate portion 9 is a silicon substrate, the operation of A103 in FIG. 2 is cleaning of the silicon substrate, for example. A part formed of the second semiconductor layer 4 and the function layer 5 in FIG. 12 is an element portion 12 being an example of the above-mentioned element portion.

Figure 13:
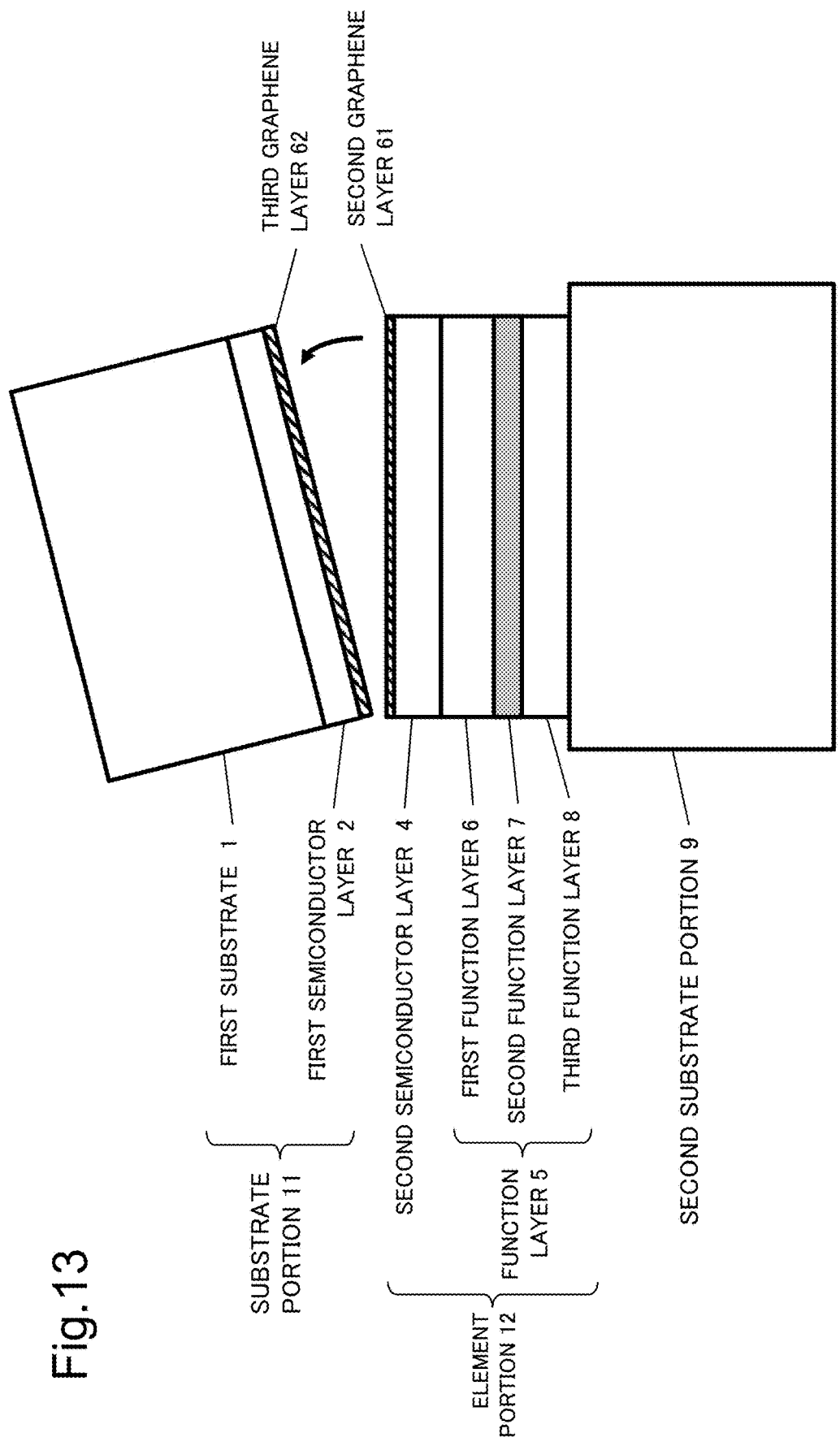
FIG. 13 is a schematic diagram (part 1) illustrating a state in which the substrate portion is cut off.
Figure 14:
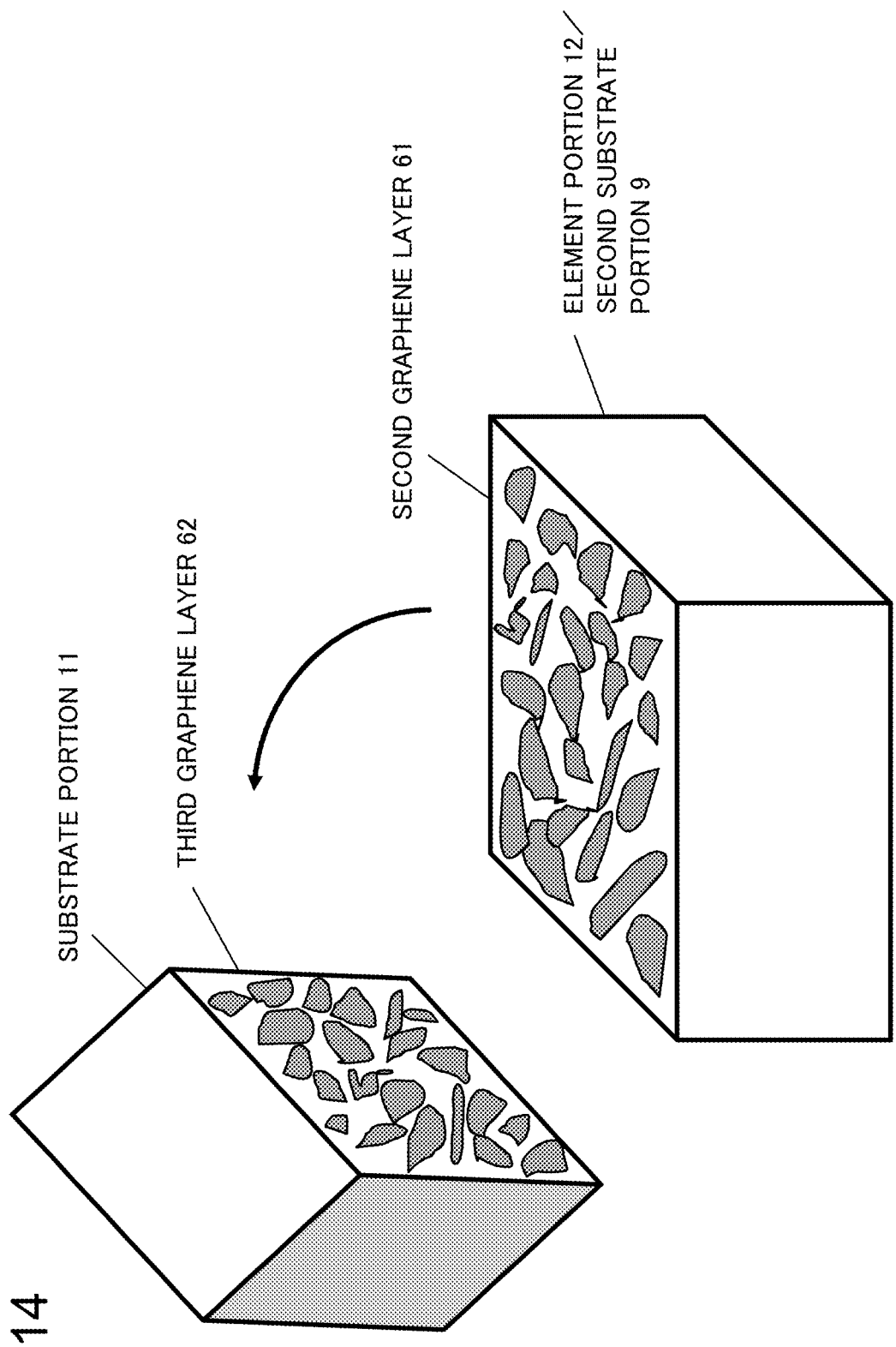
FIG. 14 is a schematic diagram (part 2) illustrating a state in which the substrate portion is cut off.
Figure 15:
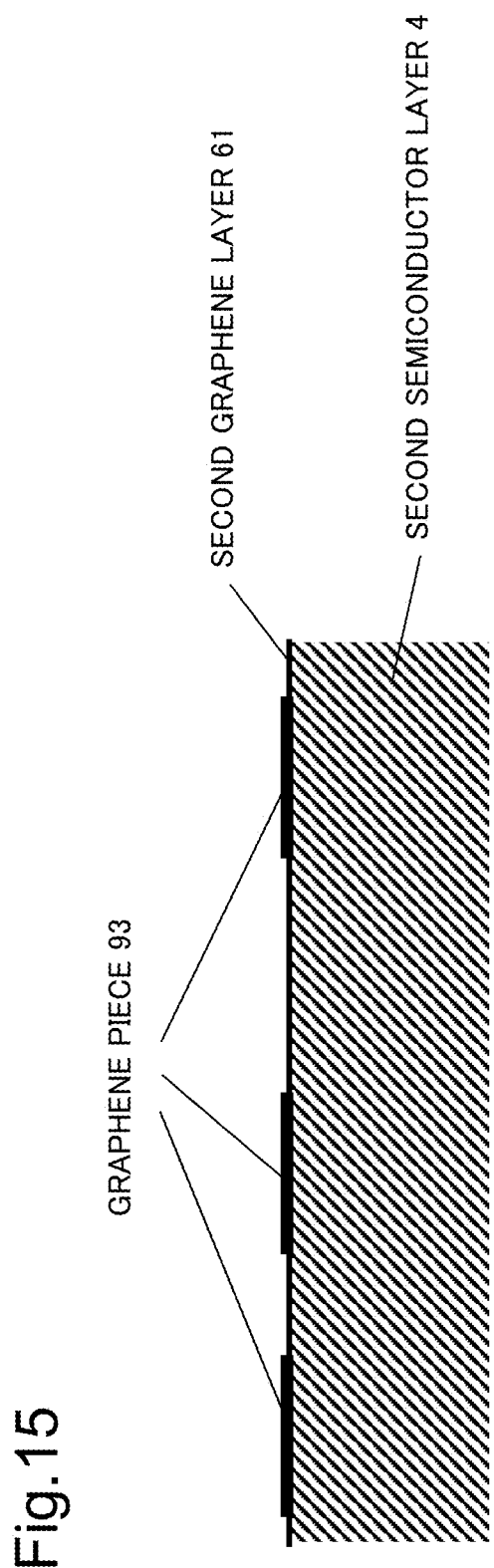
FIG. 15 is a schematic diagram illustrating graphene pieces left on a second semiconductor layer.

Next, with reference to FIGS. 13 and 14, the specific example of the operation of A105 in FIG. 2 is described.

When the operation of A105 in FIG. 2 is performed, an operator or the like fixes the second substrate portion 9, and cleaves the graphene layer 3 as a fracture surface by lifting up an end of the first substrate 1. As a result, the substrate portion 11 can be easily and completely removed from the element portion 12. In this case, with regard to a device including the function layer 5 and the second semiconductor layer 4, reproductivity and reliability of the thickness can be secured.

At a time of cleavage, whether the graphene layer 3 in FIG. 12 adheres to a side of the first semiconductor layer 2 or a side of the second semiconductor layer 4 is not determined uniquely. The graphene layer 3 is divided and left on both the surfaces as a second graphene layer 61 and a third graphene layer 62. This is because the graphene layer 3 is actually formed of graphene pieces being grains each having approximately several micrometers as in FIG. 10 instead of having one continuous even film structure. Thus, when cleavage is performed, the graphene layer 3 is divided into the second graphene layer 61 and the third graphene layer 62, and is partially left both on the second semiconductor layer 4 and the first semiconductor layer 2, as illustrated in FIG. 14.

An operator or the like may remove the second graphene layer 61 left on the side of the element portion 12, but may leave the second graphene layer 61 as it is.

Figure 16:
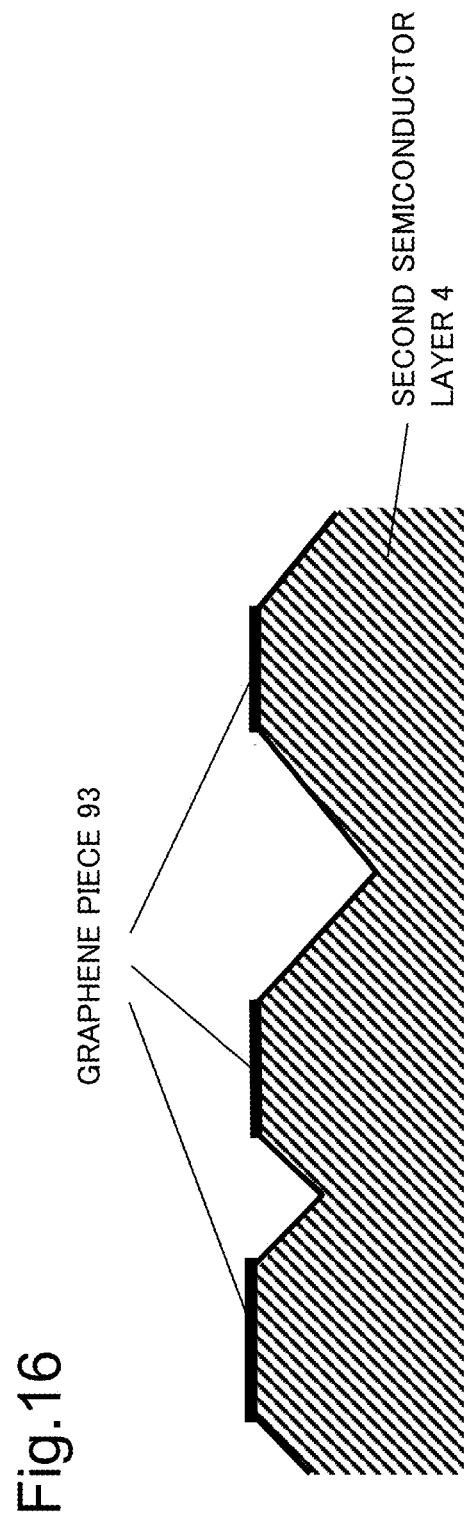
FIG. 16 is a schematic diagram illustrating a state in which the second semiconductor layer is subjected to etching with the graphene pieces as a mask.

When an operator or the like leaves the second graphene layer 61 as it is, graphene pieces 93 as the second graphene layer 61 are partially present on the second semiconductor layer 4, as illustrated in FIG. 4. In this case, an operator or the like can subject a predetermined amount of the second semiconductor layer 4 to etching with acid or the like by using the graphene pieces 93 as a mask. In this case, as illustrated in FIG. 16, an irregular structure (texture structure) can be formed on the surface of the second semiconductor layer 4. Carbon atoms constitute a six-membered ring structure, and the graphene pieces 93 is a sheet-like shape of this structure. Thus, the graphene pieces 93 are highly stable in a chemical sense, and cannot be subjected to etching with acid. Thus, the graphene pieces 93 can be used as a mask for chemical etching with acid.

A size of the irregular structure (texture structure) to be formed depends on a size of the graphene pieces 93. The size of the graphene pieces is, for example, approximately several micrometers. Thus, in a case where the semiconductor element to be manufactured is for a middle-to-far infrared ray detector, when this surface functions as a light incident surface, incidence of light having a wavelength equal to or less than a wavelength of near infrared ray can be suppressed due to diffusion, and sensitivity can be improved. Thus, formation of the irregular structure is effective particularly for the semiconductor element for a middle-to-far infrared ray detector. The graphene pieces 93 left on the surface after this processing may be left as they are, or may be completely removed. Because the graphene pieces 93 have a film thickness at a monoatomic layer level, and are much thinner than a wavelength of light, an impact on characteristics such as light receiving sensitivity can be ignored. Whether the graphene pieces are left or removed can be controlled by changing a time required for etching. Depending on a type of an etching solution, the graphene layer can be left when etching is performed for an extremely short time, and can be completely removed when etching is performed for a predetermined time or more.

Advantageous Effects

In the manufacturing method of a semiconductor element according to the present example embodiment, the element portion being the semiconductor element is formed on the substrate portion through intermediation of the graphene layer at a monoatomic layer level, and then the substrate portion is removed by being cut off at cleavage in the graphene layer. The graphene layer is soft, and hence the cleavage is performed easily. Further, the cleavage is performed easily, and hence a risk of damaging the element portion is low. Moreover, the cleavage is always generated in the graphene layer, and hence the film thickness of the semiconductor layer constituting the element portion can be controlled accurately and easily. Moreover, even when the graphene layer at a monoatomic layer level is present on the substrate portion, the element portion formed thereon can be crystal-grown while taking over the lattice constant and the like of the substrate portion. Thus, the manufacturing method and the like can secure performance of the element portion.

Thus, the manufacturing method can secure performance of the element portion, and can secure easiness in removal of the substrate portion and the film thickness and reliability of the element portion in a compatible manner.

Second Example Embodiment

The present example embodiment is an example embodiment relating to a manufacturing method in which a first recess is formed in a side portion directly on a graphene layer formed on a substrate portion and cleavage in the graphene layer is more facilitated.

[Configuration and Operation]

The manufacturing method according to the present example embodiment is illustrated in FIG. 2, and only the specific example of the operation of A102 in FIG. 2 is different. A part of the specific example of the operation of A102 in the present example embodiment, which is different from the first example embodiment, is mainly described below.

Figure 18:
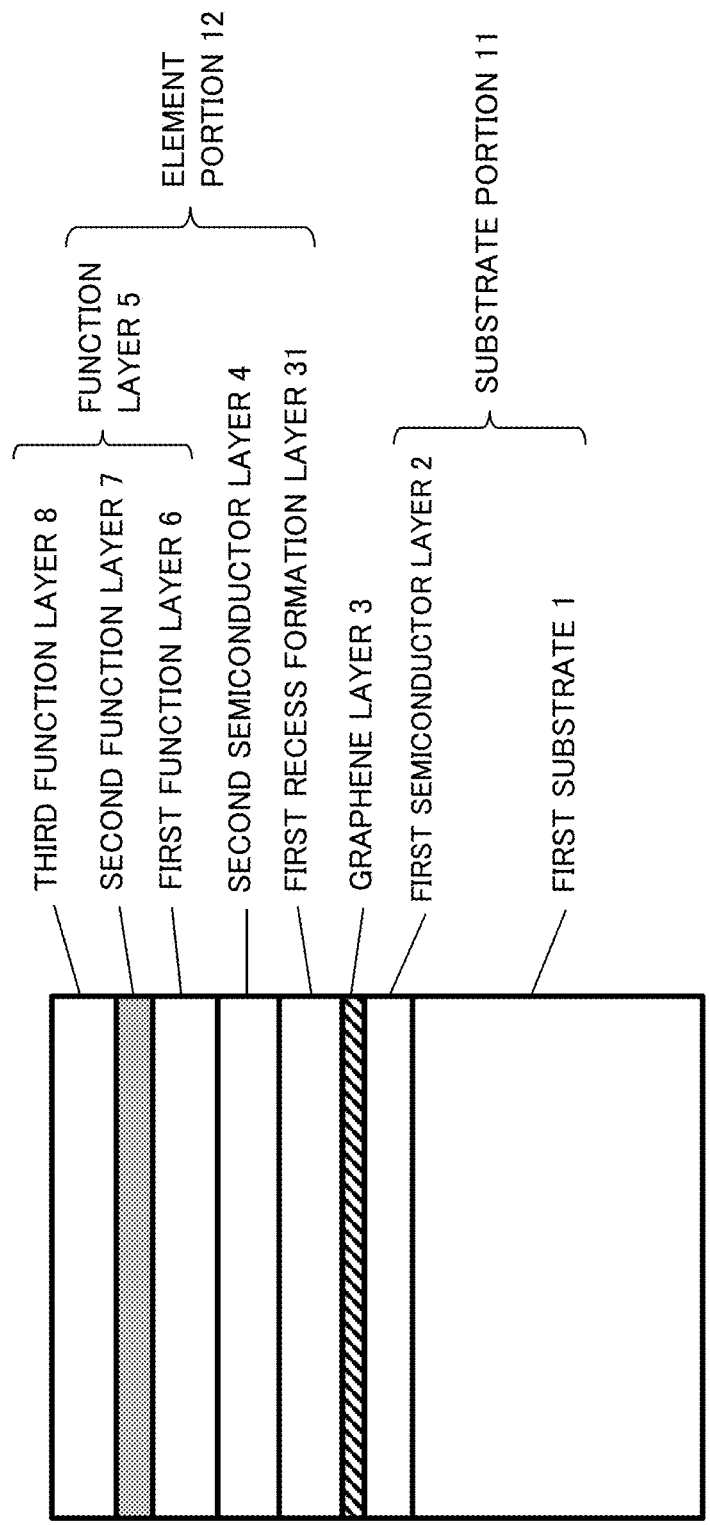
FIG. 18 is a schematic diagram illustrating a configuration in which a first recess formation layer is formed on the element portion.

First, with reference to FIGS. 18 and. 19, the specific example of the operation of A102 in the present example embodiment is described.

When the operation of A102 in the present example embodiment is performed, an operator or the like first forms the configuration illustrated in FIG. 18. The configuration in FIG. 18 is different from the configuration in FIG. 11 formed in the operation of A102 in the first example embodiment in that a first recess formation layer 31 is inserted between the graphene layer 3 and the second semiconductor layer 4. The first recess formation layer 31 is formed of a semiconductor material having a higher etching speed with respect to a predetermined etching solution, as compared to the first semiconductor layer 2 and the second semiconductor layer 4.

Thus, an operator or the like immerses the configuration in FIG. 18 in the predetermined etching solution, and the end portion of the first recess formation layer 31 is infiltrated by the etching solution. Further, the end portion of the first recess formation layer 31 is selectively subjected to etching, and a first recess 91 is formed in the side surface of the first recess formation layer 31, which is held in contact with the graphene layer 3, as illustrated in FIG. 19.

More specifically, for example, it is assumed that an operator or the like uses GaAs as a material for the first semiconductor layer 2 and the second semiconductor layer 4 and AlGaAs as a material for the first recess formation layer 31. Further, an operator or the like uses dilute hydrochloric acid as the etching solution. With this, the configuration in FIG. 19 is formed.

Figure 19:
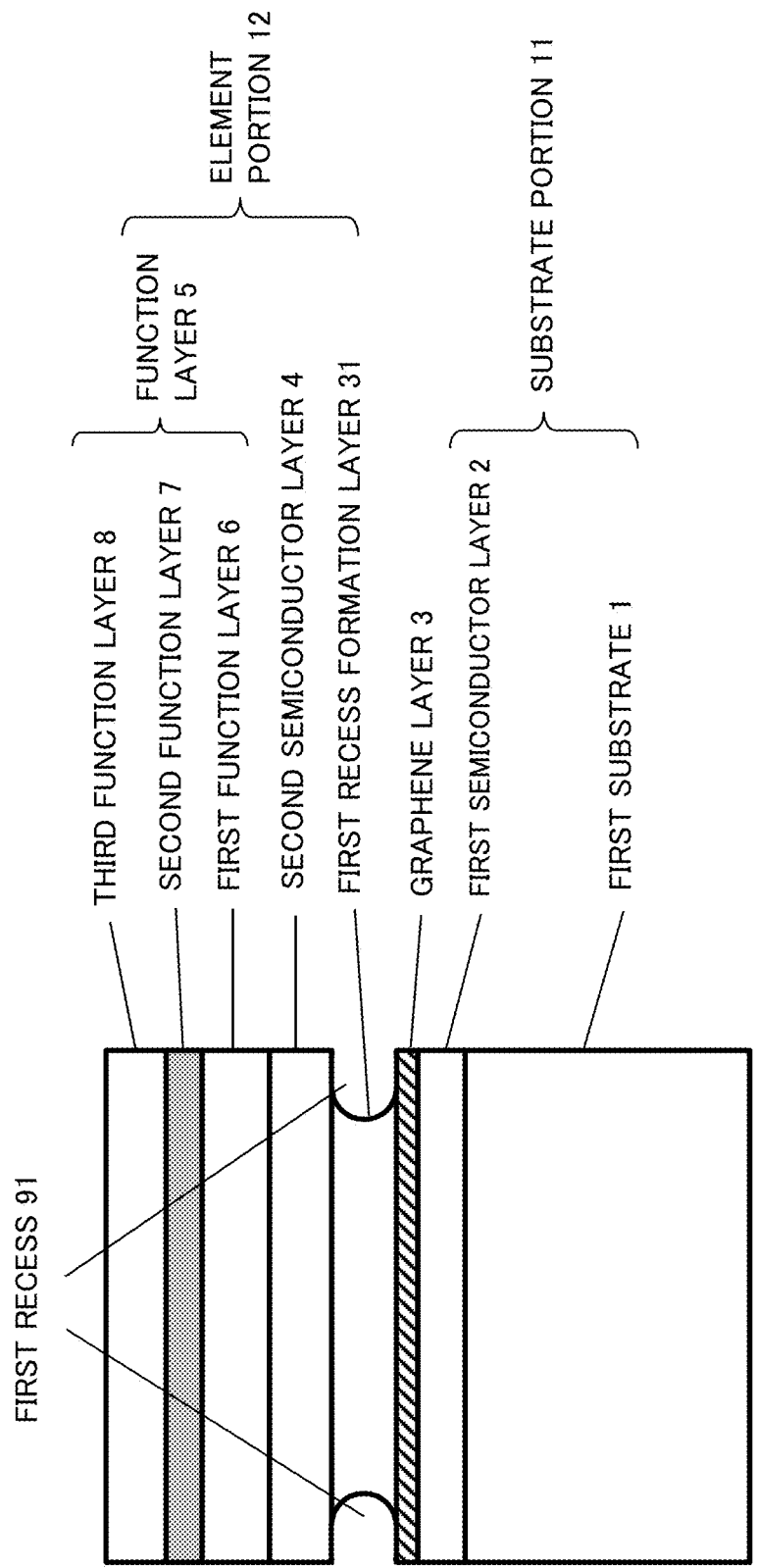
FIG. 19 is a schematic diagram illustrating a state in which a first recess is formed.

A more detailed specific example of the formation method of the configurations in FIGS. 18 and 19 is described below.

An operator or the like forms the structure other than the first recess formation layer 31 formed of AlGaAs in processing similar to that in the first example embodiment. What is different is that an operator or the like forms the first recess formation layer formed of AlGaAs by irradiating the first recess formation layer formed of AlGaAs with an Al molecular beam and a Ga molecular beam together with an As molecular beam after transfer of the graphene layer.

After that, an operator or the like forms the second semiconductor layer 4 and the function layer 5 by a method similar to that in the first example embodiment. Further, an operator or the like immerses the configuration in FIG. 18 after formation in dilute hydrochloric acid, and forms the configuration in FIG. 19 including the first recess 91 in the end portion of the first recess formation layer 31.

In the specific example, the first semiconductor layer 2 and the second semiconductor layer 4 are GaAs, and the first recess formation layer 31 is AlGaAs. An etching speed of GaAs and an etching speed of AlGaAs with respect to dilute hydrochloric acid are largely different from each other, and GaAs is rarely subjected to etching with respect to dilute hydrochloric acid wherein, although depending on an Al composition, AlGaAs is subjected to etching by several or more digits. Thus, when immersion in dilute hydrochloric acid is performed only for an extremely short time, the first recess formation layer 31 is infiltrated from the end portion, and the first recess 91 in FIG. 19 is formed. For example, when an Al composition is set to 10%, and immersion in dilute hydrochloric acid is performed for 10 seconds, the first recess 91 having a depth of several micrometers is formed in the end portion of the first recess formation layer 31.

Figure 20:
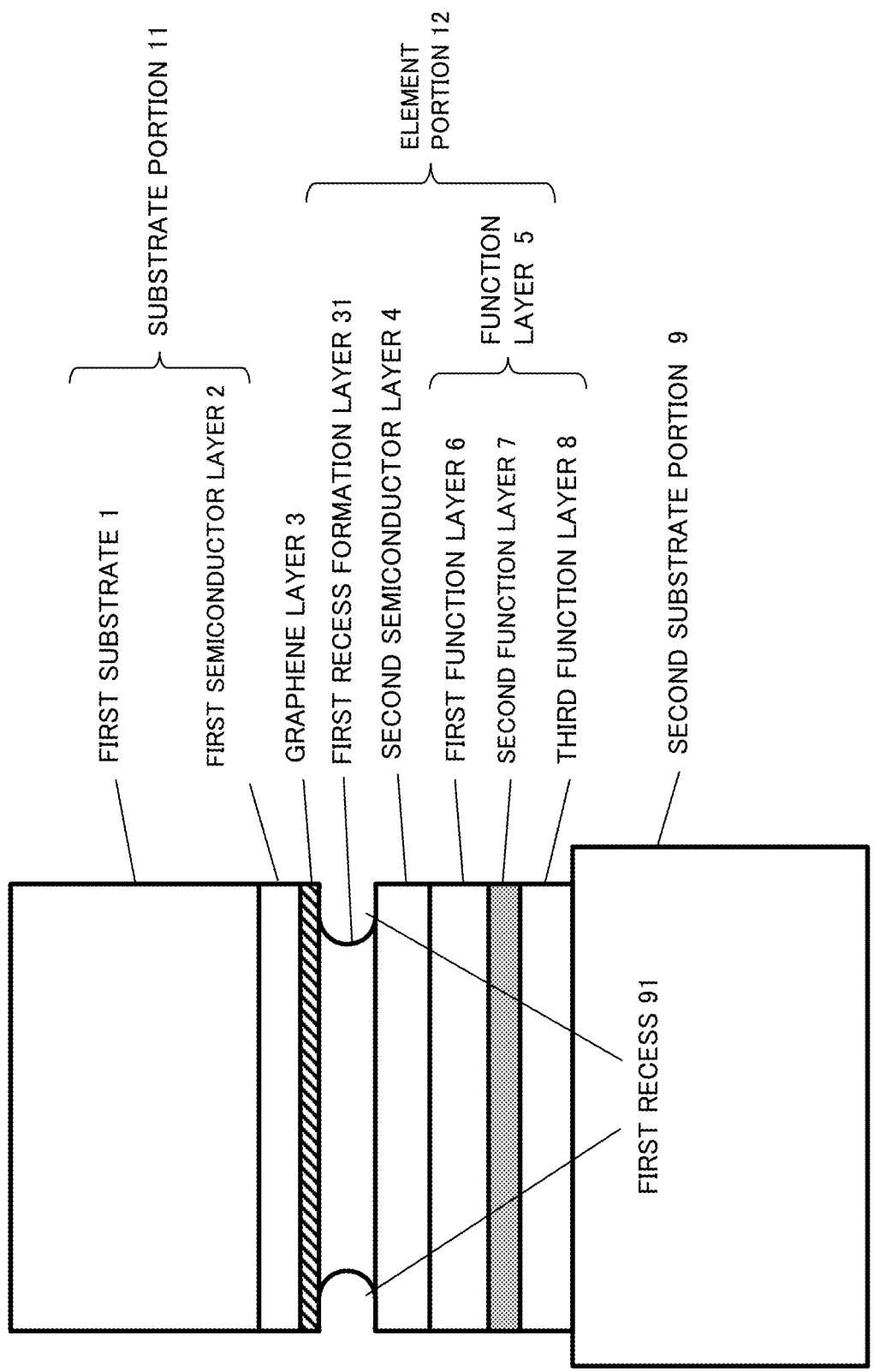
FIG. 20 is a schematic diagram illustrating a state in which the element portion is joined to the second substrate.
Figure 21:
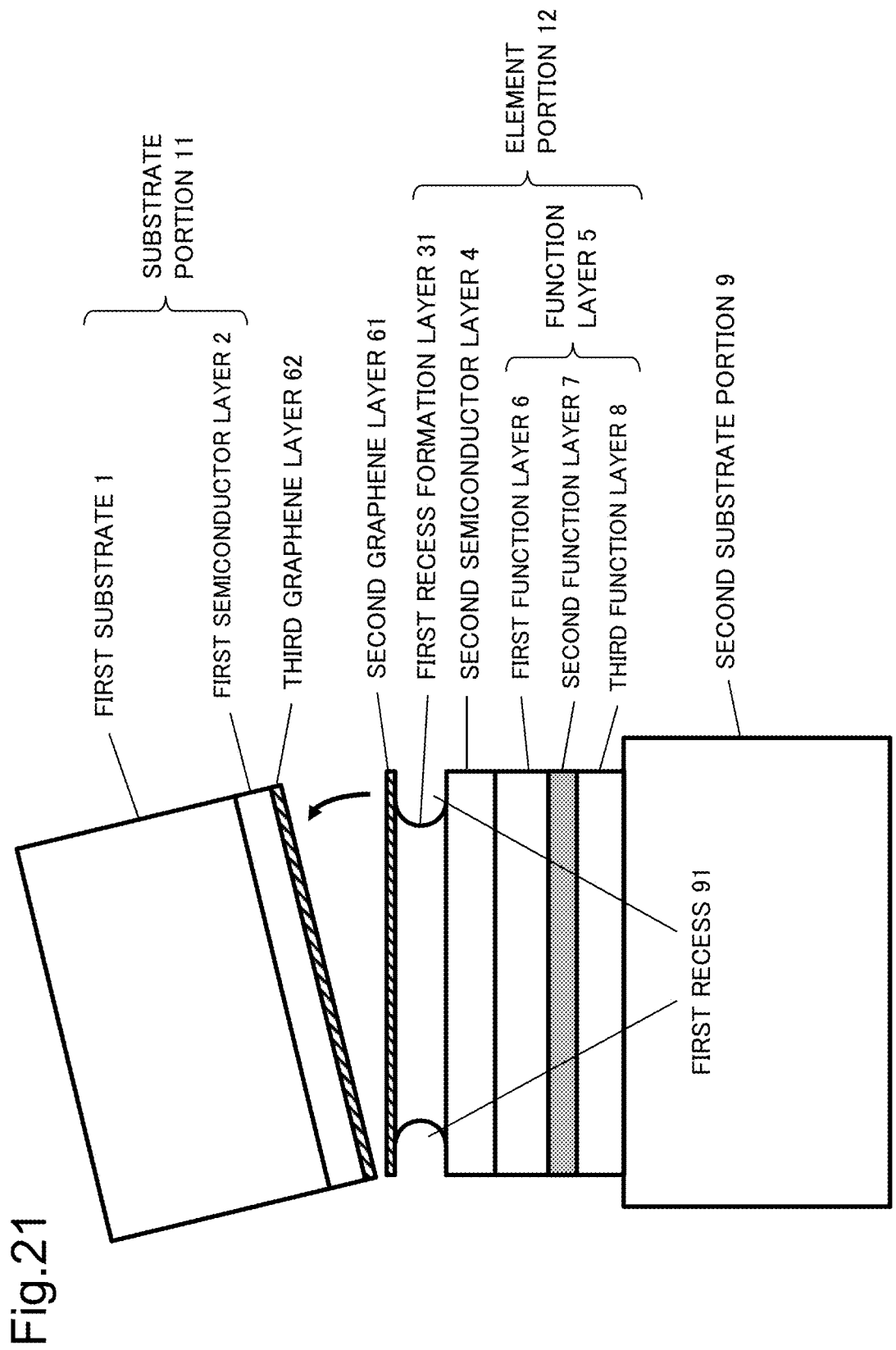
FIG. 21 is a schematic diagram illustrating a state in which the substrate portion is cut off.

After that, similarly to the case in the first example embodiment, an operator or the like fixes the function layer 5 on the second substrate portion 9, and forms the configuration illustrated in FIG. 20. Further, as illustrated in FIG. 21, an operator or the like cleaves the graphene layer 3 as a fracture surface by lifting up the end portion of the first substrate 1. In this case, the first recess 91 is present in the end portion of the first recess formation layer 31 under a state of being held in contact with the graphene layer 3, and hence an operator or the like can perform cleavage by using the second graphene layer 61 as a boundary surface in a secured manner with less force and high reproducivity.

Figure 17:
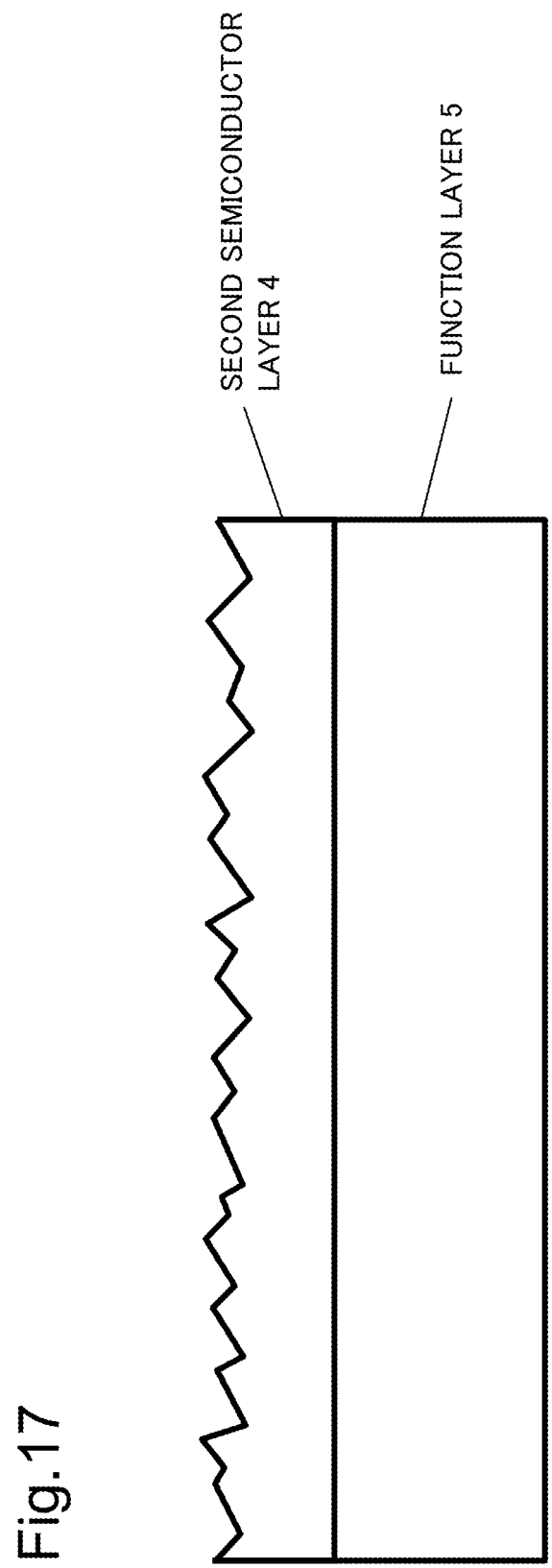
FIG. 17 is a schematic diagram illustrating irregularities in the second semiconductor layer after etching.

After the cleavage, similarly to the case in the first example embodiment, an operator or the like may leave or remove the graphene layer left after the cleavage (equivalent to the second graphene layer 61 in FIG. 13). Further, when the function layer 5 is an infrared light receiving element, similarly to the case in the first example embodiment, an operator or the like also preferably forms an irregular structure (a texture structure equivalent to the texture structure in FIG. 16 or 17) through use of the second graphene layer 61. Herein, the light receiving element is an element that converts received light into electricity.

Advantageous Effects

The manufacturing method according to the present example embodiment includes the processing similar to that of the manufacturing method according to the first example embodiment, and exerts the similar effects. In addition to this, the manufacturing method according to the present example embodiment includes forming the first recess on the side surface of the element portion under a state of being adjacent to the graphene layer being a graphene layer for cleavage. With this, the manufacturing method facilitates cutting-off of the substrate portion from the element portion at cleavage in the graphene layer at a higher level as compared to the case of the first example embodiment.

Third Example Embodiment

The present example embodiment is an example embodiment relating to a manufacturing method of a semiconductor element in which a recess is formed in a side portion of a semiconductor layer on a side of a substrate portion adjacent to a graphene layer for cleavage.

[Configuration and Operation]

Figure 22:
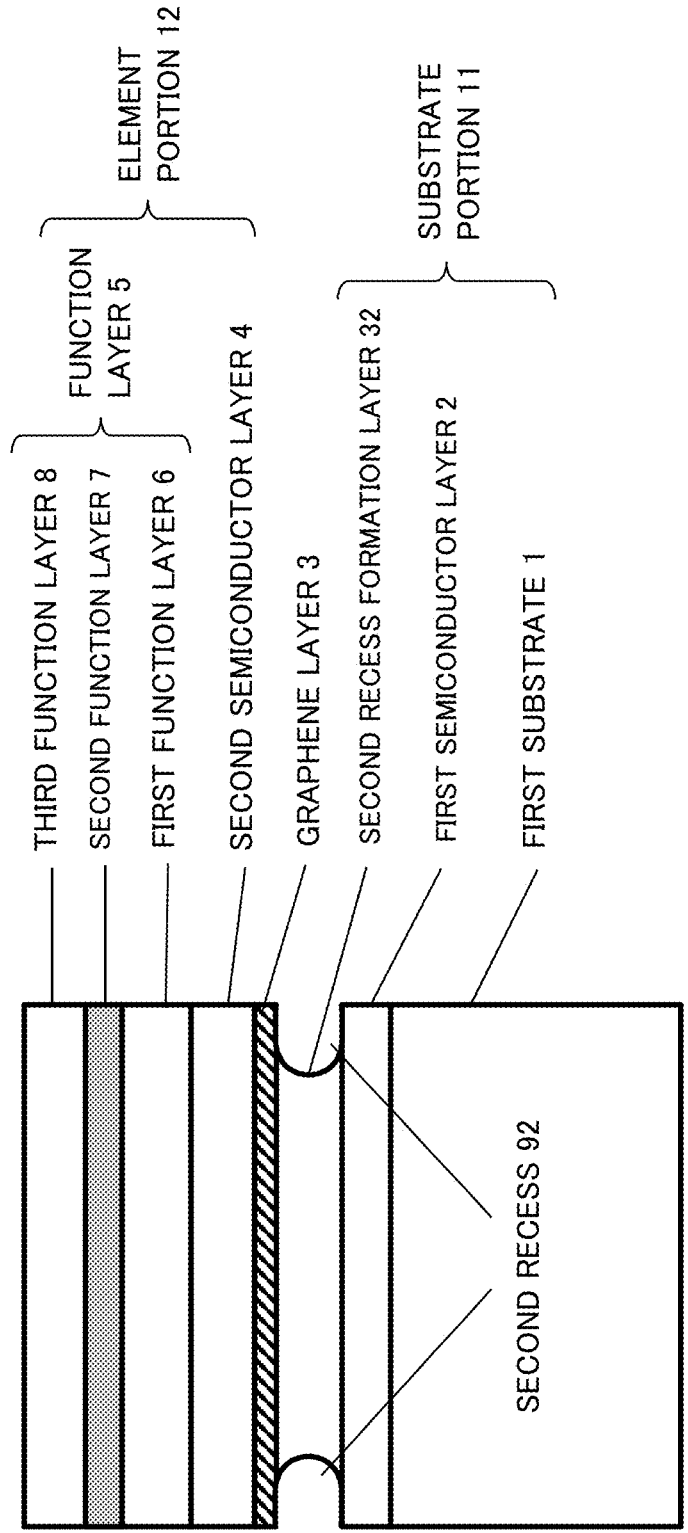
FIG. 22 is a schematic diagram illustrating a state in which a second recess is formed.

The manufacturing method of a semiconductor element according to the present example embodiment is illustrated in FIG. 2, which is similar to the case in the second example embodiment, but the first recess formation layer 31 in FIGS. 18 to 21 is not present. In place of this, as illustrated in FIG. 22, a second recess formation layer 32 is inserted between the graphene layer 3 and the first semiconductor layer 2. The first recess formation layer 31 and the second recess formation layer 32 have similar structures and functions, but an insertion position differs.

The second recess formation layer 32 is formed of a material having a higher etching speed with respect to a predetermined etching solution as compared to the first semiconductor layer 2 and the second semiconductor layer 4. After the semiconductor structure is formed, immersion in the predetermined etching solution is performed, and thus the end portion of the second recess formation layer 32 is infiltrated in the etching solution, the end portion of the second recess formation layer 32 is selectively subjected to etching, and a second recess 92 in contact with the graphene layer 3 is formed.

More specifically, an operator or the like uses GaAs as a material for the first semiconductor layer 2 and the second semiconductor layer 4 and AlGaAs as a material for the second recess formation layer 32, and uses dilute hydrochloric acid as the etching solution. Further, similarly to the cases in the first and second example embodiments, an operator or the like fixes the function layer 5 on the second substrate portion 9, and cleaves the graphene layer 3 as a fracture surface by lifting up the end portion of the first substrate 1. In this case, the second recess 92 is present in the end portion of the second recess formation layer 32 under a state of being held in contact with the graphene layer 3, an operator or the like can perform cleavage by using the single layer graphene as a boundary surface in a secured manner with less force and high reproducivity. After the cleavage, similarly to the cases in the first and second example embodiments, an operator or the like may leave or remove the second graphene layer 61. Further, when the device is an infrared light receiving element, it is effective for an operator or the like to form an irregular structure (a texture structure equivalent to the texture structure in FIG. 16 or 17) through use of the second graphene layer 61.

Advantageous Effects

The manufacturing method according to the present example embodiment includes the processing similar to that of the manufacturing method according to the first example embodiment, and exerts the similar effects. In addition to this, the manufacturing method according to the present example embodiment includes forming the second recess on the side surface of the substrate portion under a state of being in contact with the graphene layer being a graphene layer for cleavage. With this, the manufacturing method facilitates cutting-off of the substrate portion from the element portion at cleavage in the graphene layer at a higher level as compared to the case of the first example embodiment.

Fourth Example Embodiment

The present example embodiment is an example embodiment relating to a manufacturing method of a semiconductor element in which recesses are provided in a side portion of a semiconductor layer in both sides of a substrate portion and an element portion adjacent to a graphene layer for cleavage.

[Configuration and Operation]

Figure 23:
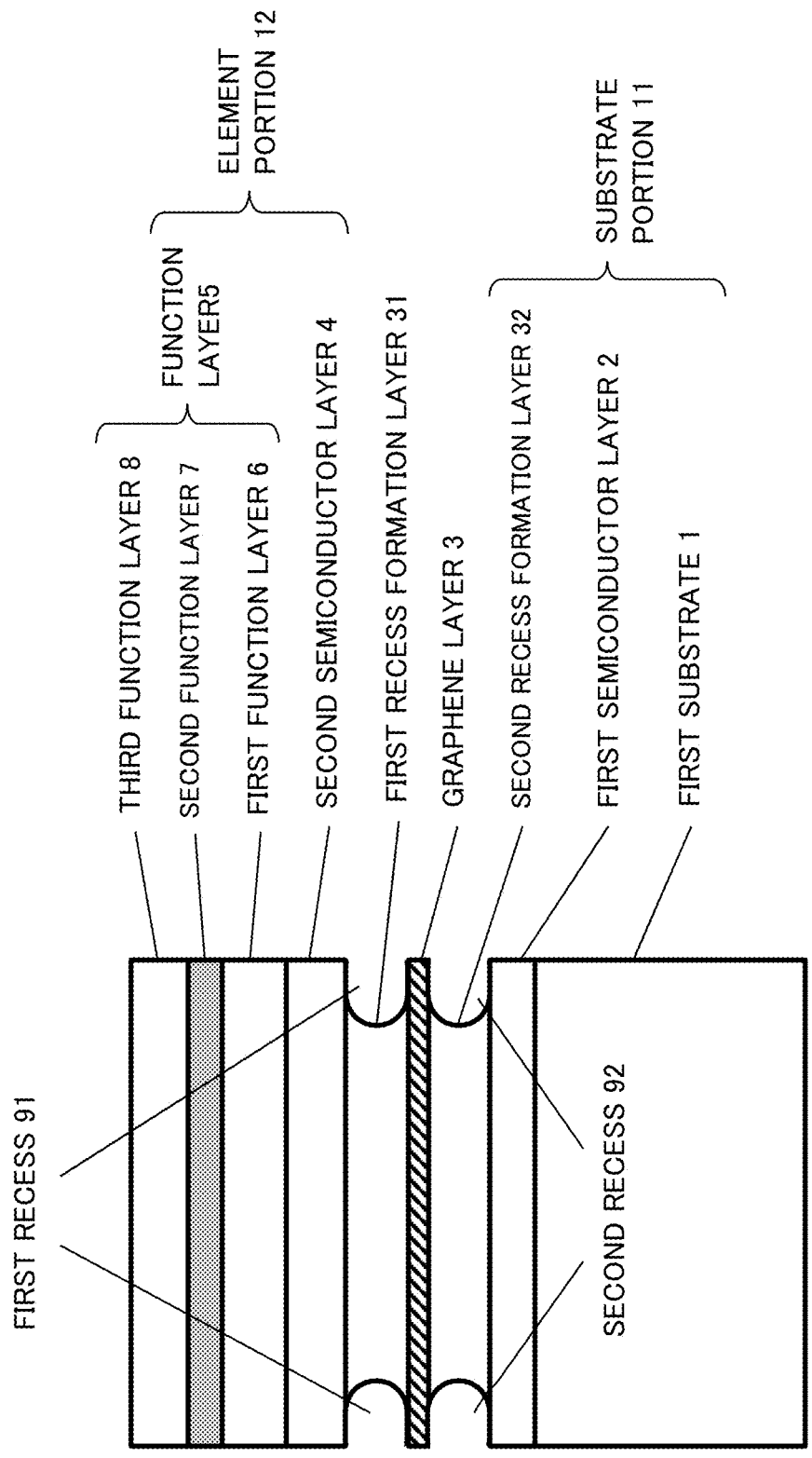
FIG. 23 is a schematic diagram illustrating a state in which the first recess and the second recess are formed.

The manufacturing method of a semiconductor element according to the present example embodiment is illustrated in FIG. 2 similarly to the case in the second example embodiment. Further, in the middle of the operation of A102, as illustrated in FIG. 23, the first recess formation layer 31 and the second recess formation layer 32 are inserted in both sides of the graphene layer 3. The first recess formation layer 31 and the second recess formation layer 32 have similar structures and functions to those in the cases in the second and third example embodiments. As an operation subsequent to the operation of A102, similarly in the second and third example embodiments, an operator or the like forms the first recess 91 and the second recess 92, which are illustrated in FIG. 23, in the end portions through selective etching. An operator or the like provides the first recess 91 and the second recess 92 in both the sides of the graphene layer 3, and thus can perform cleavage in the operation of A105 by using the graphene layer 3 as a boundary surface in a secured manner with less force and high reproducibility.

After the cleavage, similarly to the cases in the first to third example embodiments, an operator or the like may leave or remove the second graphene layer 61. Further, when the device is an infrared light receiving element, it is preferred that an operator or the like form an irregular structure (texture structure) through use of the second graphene layer 61.

Advantageous Effects

The manufacturing method according to the present example embodiment includes the processing similar to that of the manufacturing method according to the first example embodiment, and exerts the similar effects. In addition to this, the manufacturing method according to the present example embodiment includes forming the recesses in both the side surfaces of the substrate portion and the element portion under a state of being adjacent to the graphene layer being a graphene layer for cleavage. With this, the manufacturing method facilitates cutting-off of the substrate portion from the element portion at cleavage in the graphene layer at a higher level as compared to the case of the first example embodiment.

Fifth Example Embodiment

The present example embodiment is an example embodiment relating to a manufacturing method in a case where the second substrate portion illustrated in FIG. 2 includes metal bumps and underfills and where a semiconductor element is close to an actual hybrid type light receiving element (infrared light receiving element) as disclosed in PTL 1.
[Configuration and Operation]

The manufacturing method of a semiconductor element according to the present example embodiment is illustrated in FIG. 2, but the specific examples of the operations illustrated in FIG. 2 are partially different from the cases in the first to fourth example embodiments. With reference to FIGS. 24 to 32, specific examples of the operations, which are illustrated in FIG. 2, in the present example embodiment are described below.

Figure 24:
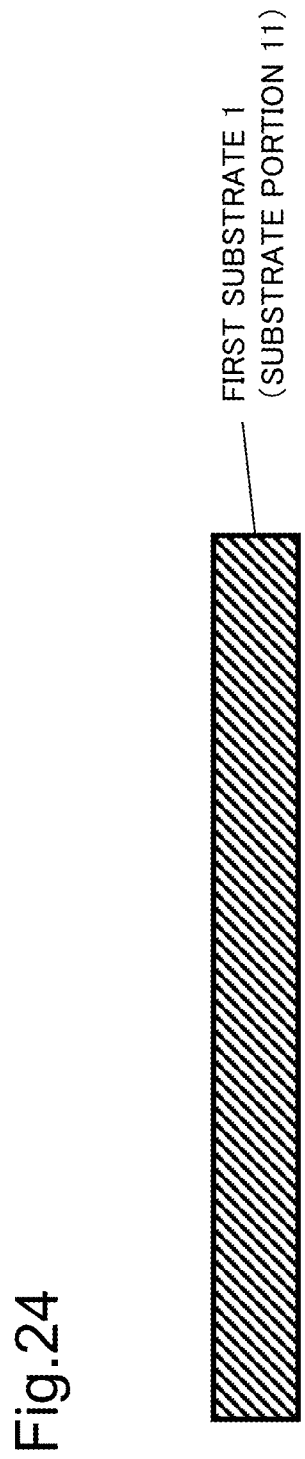
FIG. 24 is a schematic diagram illustrating the substrate portion.

In the manufacturing method of a semiconductor element according to the present example embodiment, as the operation of A101 in FIG. 2, as illustrated in FIG. 24, an operator or the like first prepares the substrate portion 11 formed of the first substrate 1. Note that a semiconductor layer equivalent to the first semiconductor layer 2 illustrated in FIG. 3 may be formed on the substrate portion 11.

Figure 25:
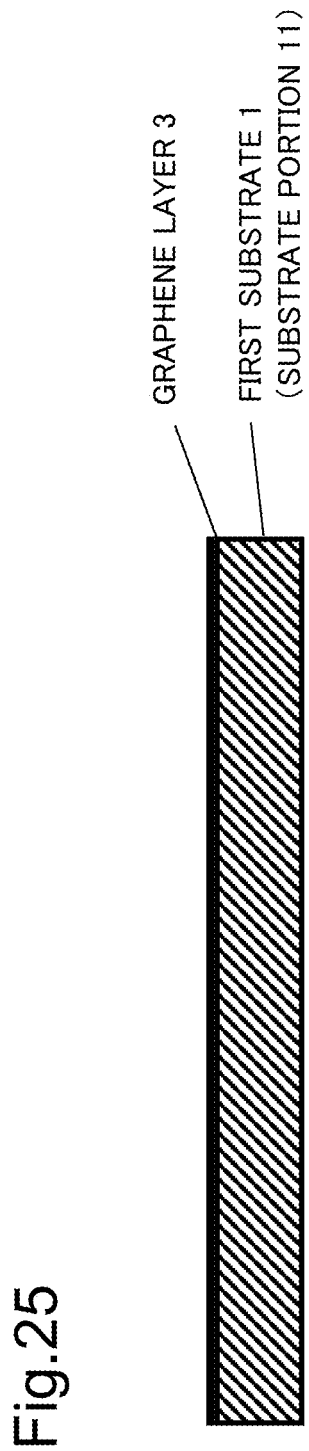
FIG. 25 is a schematic diagram illustrating a state in which the graphene layer is formed on the substrate portion.

Subsequently, as the operation of A101-2, as illustrated in FIG. 25, an operator or the like forms the graphene layer 3 on the substrate portion 11. The formation method of the graphene layer 3 is as described with reference to FIGS. 4 to 9.

Figure 26:
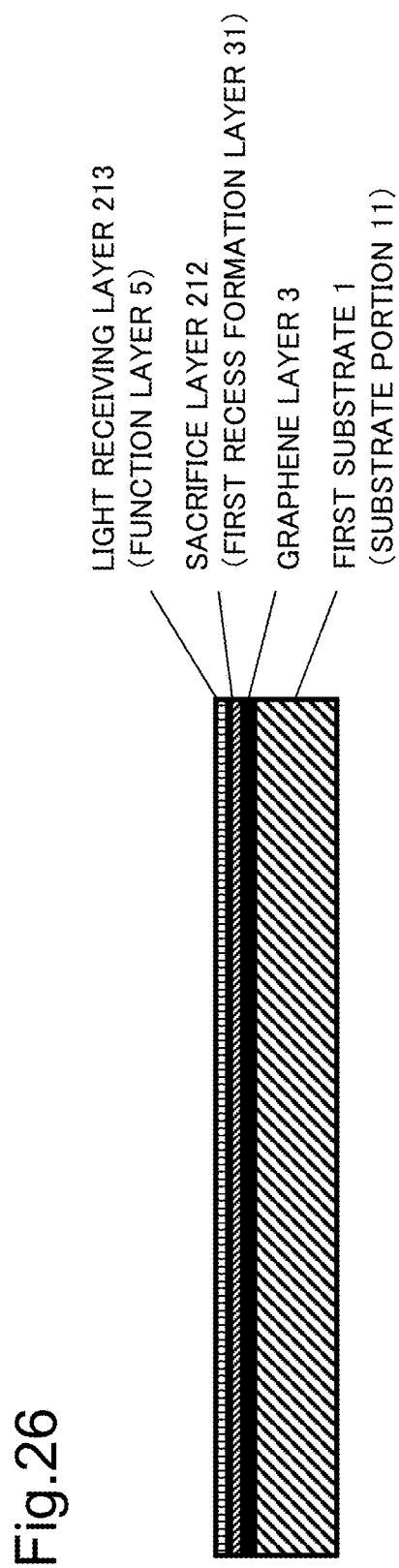
FIG. 26 is a schematic diagram illustrating a state in which a sacrifice layer and a light receiving layer are formed on the graphene layer.

Subsequently, as the operation of A102, as illustrated in FIG. 26, an operator or the like laminates a sacrifice layer 212 and a light receiving layer 213. Herein, the sacrifice layer 212 is equivalent to the first recess formation layer 31 in FIG. 18. It is assumed that the sacrifice layer 212 is formed of a material having an etching speed with respect to a predetermined etching solution, which is prominently higher than the light receiving layer 213 and the first substrate 1. Further, the light receiving layer 213 is a laminated body including the second semiconductor layer 4 and the function layer 5 in FIG. 18.

Figure 27:
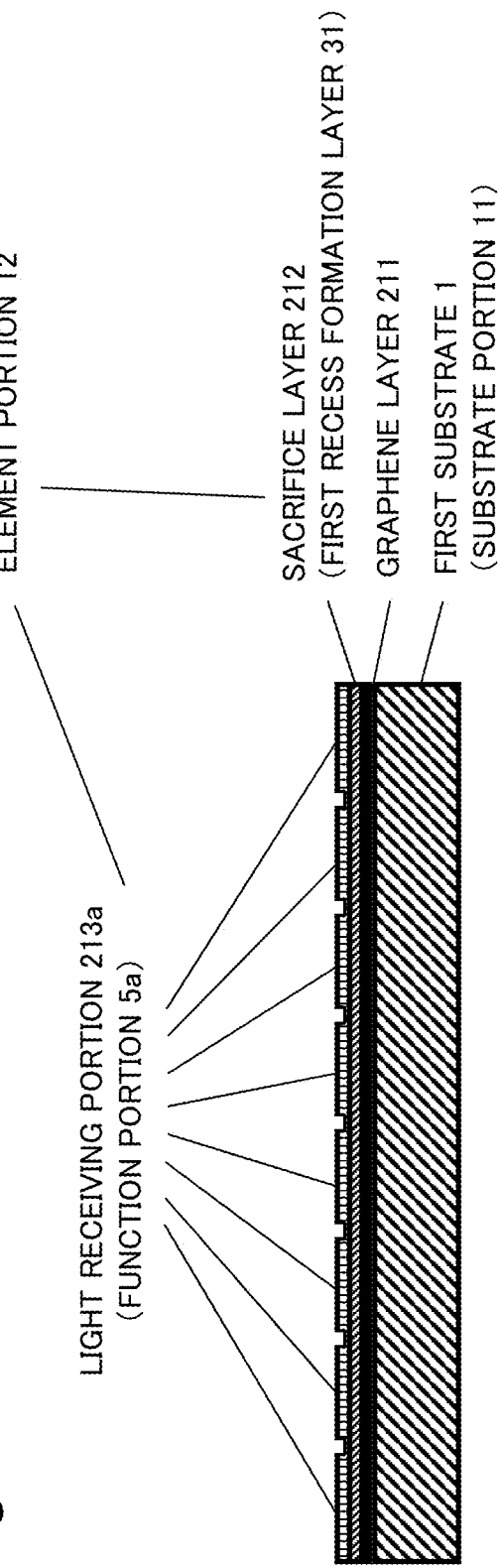
FIG. 27 is a schematic diagram illustrating a state in which the light receiving portion is formed by patterning.

After that, an operator or the like performs patterning by subjecting the light receiving layer 213 to etching through resist formation and chemical etching, and forms light receiving portions 213a as illustrated in FIG. 27. The combination of the sacrifice layer 212 and the light receiving portions 213a illustrated in FIG. 27 is equivalent to the element portion 12 being a specific example of the element portion illustrated in FIG. 2.

Figure 28:
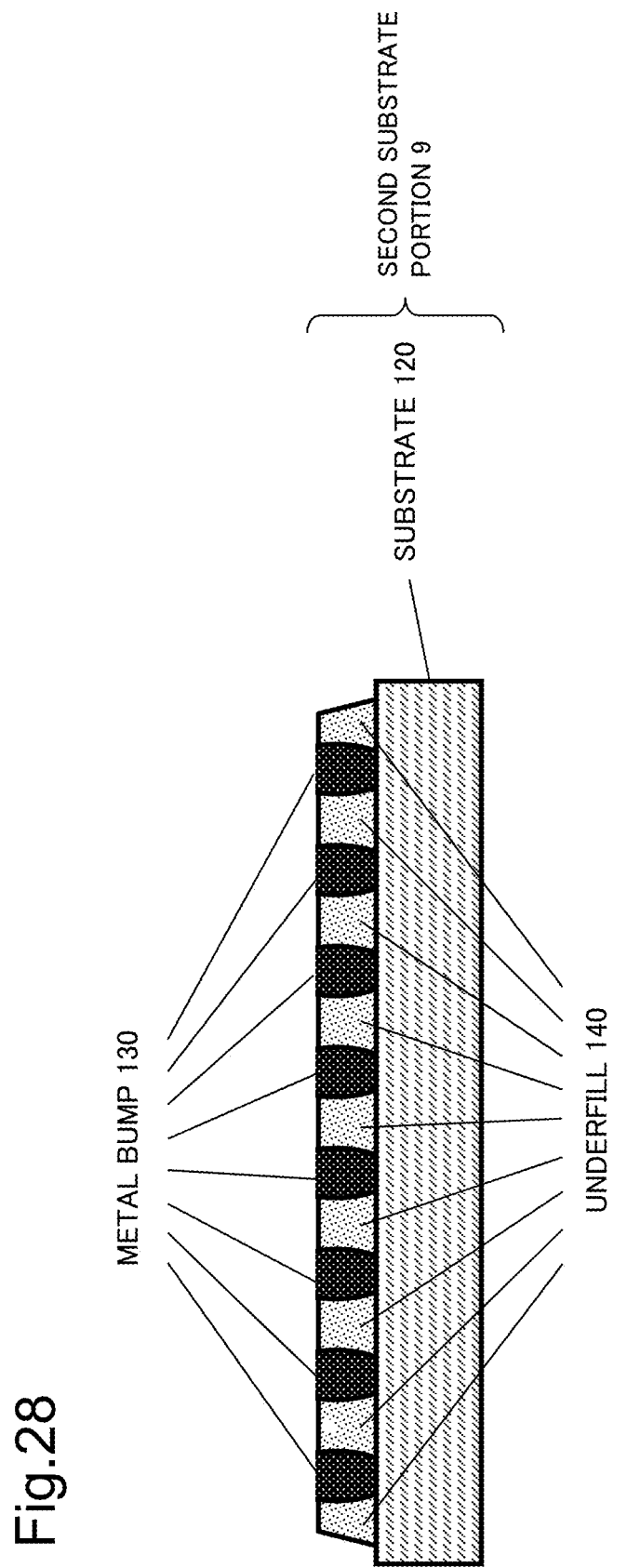
FIG. 28 is a schematic diagram illustrating the second substrate portion including metal bumps.

Meanwhile, as the operation of A103 in FIG. 2, an operator or the like forms the second substrate portion 9 in FIG. 28 being an example of the second substrate portion illustrated in FIG. 2, which is achieved by forming metal bumps 130 and underfills 140 on a substrate 120. The substrate 120 is a circuit board including predetermined wiring lines formed thereon, and each of the metal bumps 130 is connected to each of the wiring lines. Note that the method of forming the configuration in FIG. 28 is publicly known, and description for the generation method thereof is herein omitted.

Figure 29:
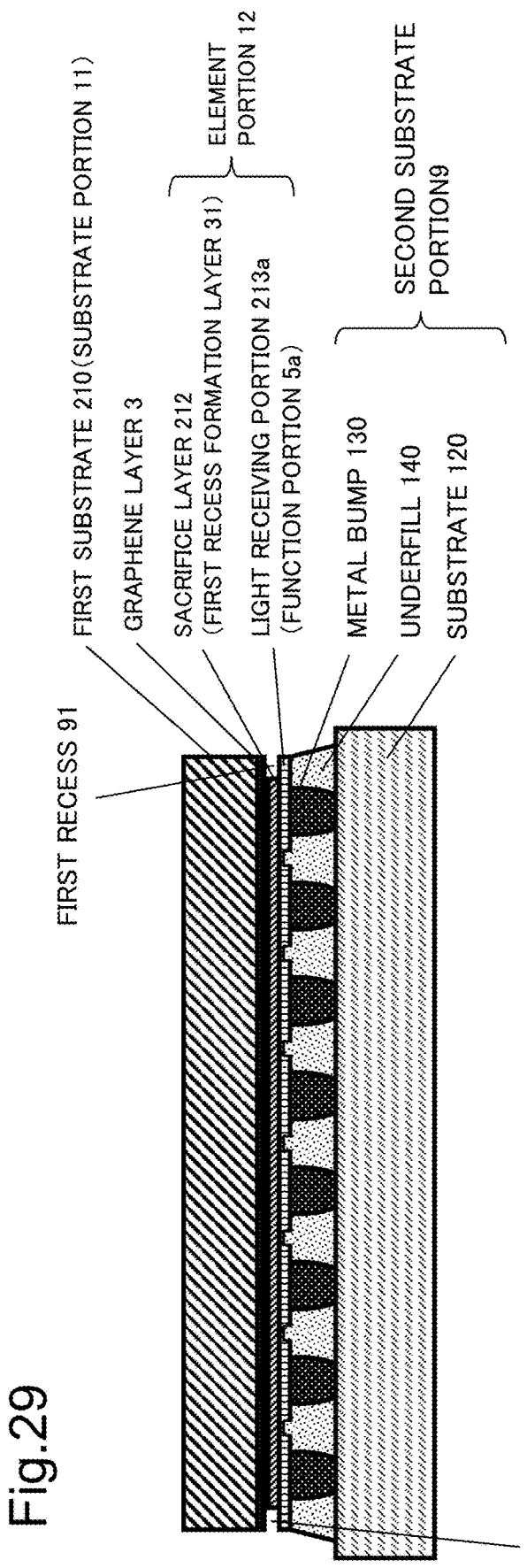
FIG. 29 is a schematic diagram illustrating a state in which the configuration of FIG. 27 is joined to the second substrate portion in FIG. 28.
Figure 30:
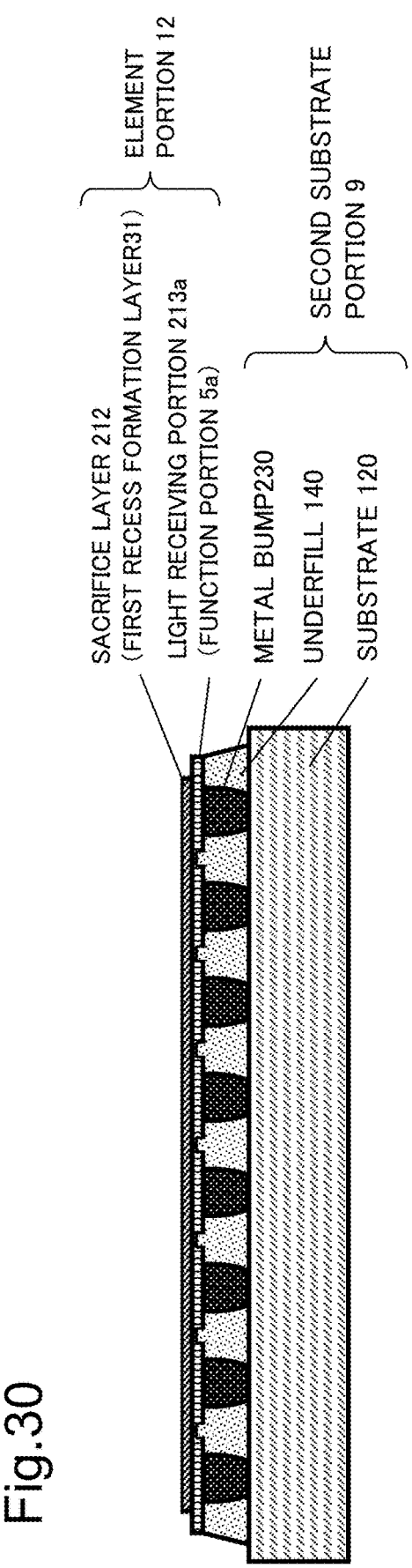
FIG. 30 is a schematic diagram illustrating a state in which the substrate portion is removed.

Subsequently, an operator or the like forms the configuration in FIG. 29 by reversely setting and joining the configuration in FIG. 27 to the configuration in FIG. 28 and performing immersion in the etching solution that preferentially subjects the sacrifice layer 212 to etching. In the configuration in FIG. 29, each of the light receiving portions 213a is joined to each of the metal bumps 130. Further, the first recess 91 achieved by the above-mentioned etching is formed in the side surface of the sacrifice layer 212. The first recess 91 facilitates cleavage in the graphene layer 3, and is equivalent to the first recess 91 illustrated in FIGS. 19 to 21. With the first recess 91 and the cleavage in the graphene layer 3, the substrate portion 11 can be easily peeled off and removed from the laminated body including the sacrifice layer 212, the light receiving portions 213a, and the second substrate portion 9. FIG. 30 is a diagram illustrating the configuration achieved by removing the substrate portion 11 from the configuration in FIG. 29.

Figure 31:
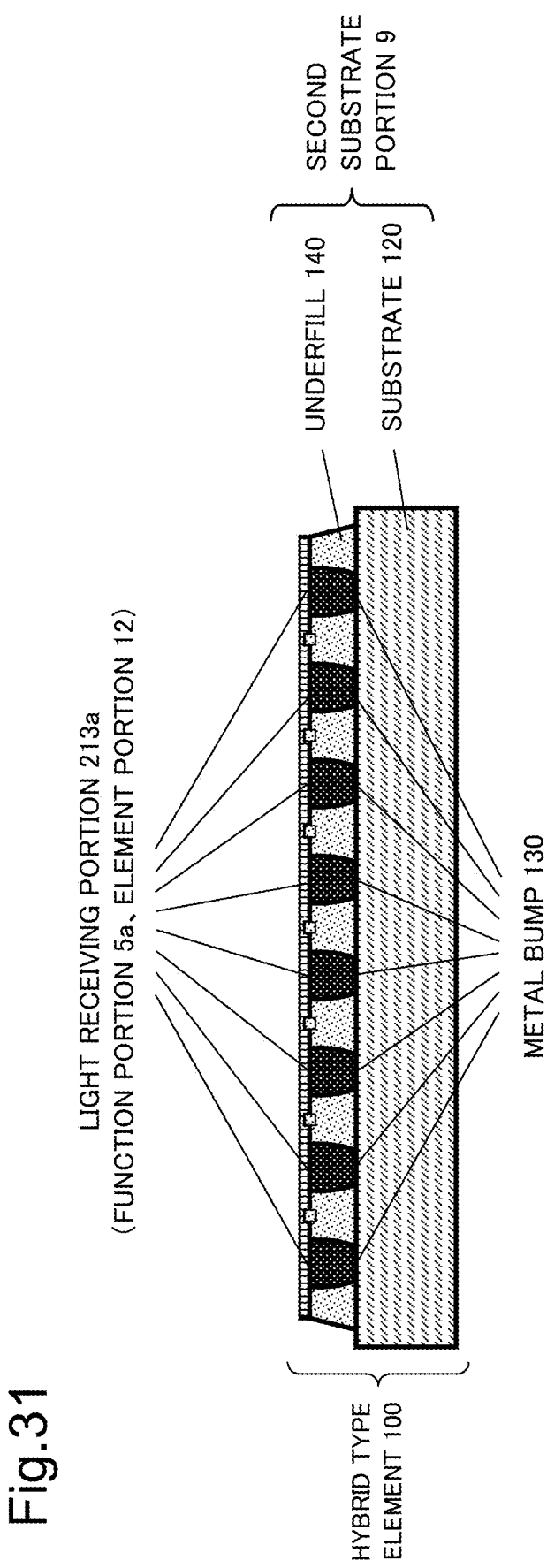
FIG. 31 is a schematic diagram illustrating a state in which the sacrifice layer is removed.

Subsequently, an operator or the like immerses the configuration in FIG. 30 in the above-mentioned etching solution, and removes the sacrifice layer 212. With this, as illustrated in FIG. 31, the hybrid type semiconductor element 100 including the light receiving portions 213a exposed to the upper side is formed.

Advantageous Effects

When the semiconductor element is close to an actual hybrid type light receiving element, the manufacturing method of a semiconductor element according to the present example embodiment exerts the similar effects to those in the manufacturing method of a semiconductor element according to the second example embodiment.

Figure 32:
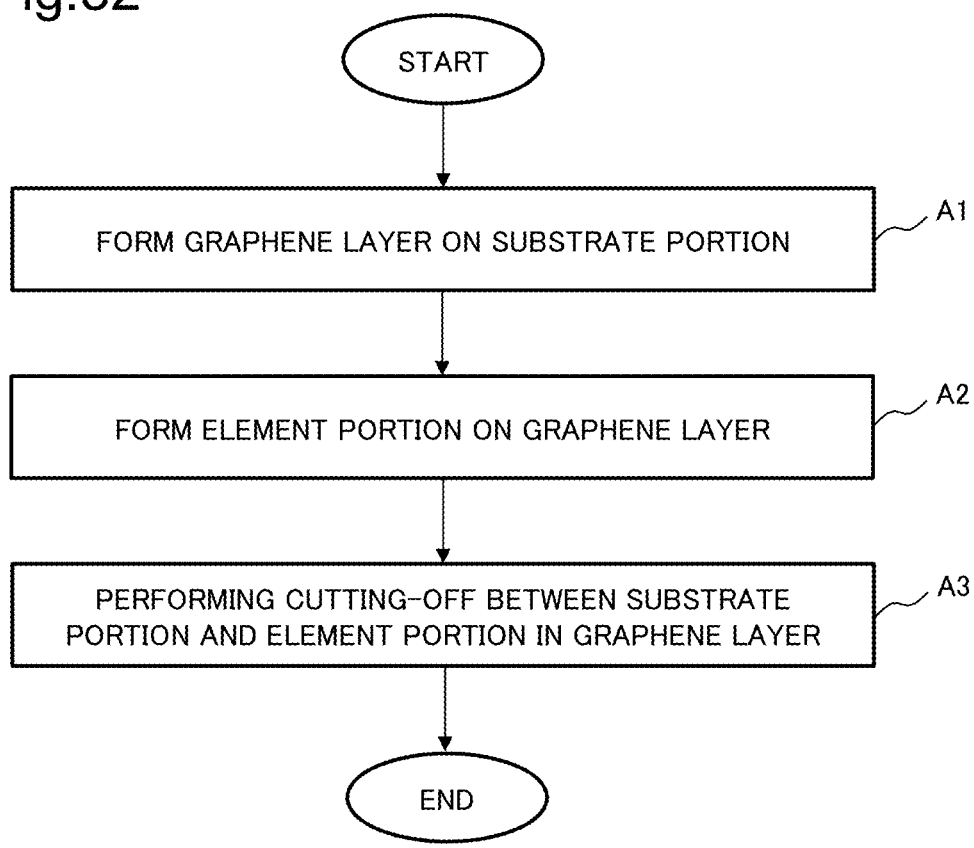
FIG. 32 is a schematic diagram illustrating a minimum configuration of a manufacturing method according to an example embodiment.

FIG. 32 is a schematic diagram illustrating a minimum configuration of a manufacturing method according to an example embodiment.

When the manufacturing method of a semiconductor element illustrated in FIG. 32 is started, first, as an operation of A1, a graphene layer is formed on a substrate portion formed of a semiconductor. Further, as an operation of A2, an element portion is formed on the graphene layer, the element portion including a semiconductor layer directly formed on the graphene layer, which takes over crystal information relating to the substrate portion when the semiconductor layer is formed on the substrate portion without intermediation of the graphene layer. Further, as an operation of A3, cutting-off between the substrate portion and the element portion is performed at the graphene layer.

The graphene layer has a film thickness at a monoatomic layer level, and hence the element portion formed on the graphene layer takes over the crystal information relating to the substrate portion. Thus, the element portion may exert similar functions to those in a case where the element portion is formed on the substrate portion without intermediation of the graphene layer. Moreover, the cutting-off may be performed easily at the graphene layer.

Thus, the manufacturing method enables simple removal of the substrate (the substrate portion) used for manufacturing the semiconductor element (the element portion).

Thus, the manufacturing method exerts the effects described in the section of [Effects of Invention], due to the configuration.

Although the example embodiments according to the present invention have been described above, the present invention is not limited to the example embodiments described above, and further modifications, replacements, and adjustments may be made without departing from the basic technical idea of the present invention. For example, the configuration of elements shown in each drawing is an example for helping understanding the present invention, and is not limited to the configurations shown in these drawings.

The whole or part of the example embodiments disclosed above can be described as, but not limited to, the following supplementary notes.

(Supplementary Note 1)
A manufacturing method for a semiconductor element, including:
forming a graphene layer on a substrate portion formed of a semiconductor;
forming an element portion on the graphene layer, the element portion including a semiconductor layer directly formed on the graphene layer, which takes over crystal information relating to the substrate portion when the semiconductor layer is formed on the substrate portion without intermediation of the graphene layer; and
performing cutting-off between the substrate portion and the element portion at the graphene layer.

(Supplementary Note 2)
The manufacturing method according to Supplementary Note 1, wherein the semiconductor layer takes over the information.

(Supplementary Note 3)
The manufacturing method according to Supplementary Note 1 or 2, wherein the information includes a lattice constant of crystal and orientation of the crystal.

(Supplementary Note 4)
The manufacturing method according to any one of Supplementary Notes 1 to 3, wherein the substrate portion includes a first semiconductor layer formed on a first substrate being a semiconductor substrate, and the graphene layer is formed on the first semiconductor layer.

(Supplementary Note 5)
The manufacturing method according to Supplementary Note 4, wherein the first semiconductor layer is a chemical compound containing Ga and As.

(Supplementary Note 6)
The manufacturing method according to any one of Supplementary Notes 1 to 5, further including: forming a second semiconductor layer in contact with the graphene layer when the element portion is formed.

(Supplementary Note 7)
The manufacturing method according to Supplementary Note 6, wherein the second semiconductor layer is a chemical compound containing Ga and As.

(Supplementary Note 8)
The manufacturing method according to any one of Supplementary Notes 1 to 7, further including:
forming a first recess on a side portion of the element portion under a state of being held in contact with the graphene layer; and
performing the cutting-off after forming the first recess.

(Supplementary Note 9)
The manufacturing method according to Supplementary Note 8, wherein the first recess is formed by forming, on the graphene layer, a first recess formation layer for forming the first recess and recessing a side portion of the first recess formation layer.

(Supplementary Note 10)
The manufacturing method according to Supplementary Note 9, further including recessing the side portion of the first recess formation layer through first chemical etching.

(Supplementary Note 11)
The manufacturing method according to Supplementary Note 9 or 10, wherein the first recess formation layer is a chemical compound containing Al, Ga, and As.

(Supplementary Note 12)
The manufacturing method according to any one of Supplementary Notes 1 to 11, further including: forming a second recess on a side portion of the substrate portion under a state of being held in contact with the graphene layer; and performing the cutting-off after forming the second recess.

(Supplementary Note 13)
The manufacturing method according to Supplementary Note 12, wherein the second recess is formed by forming, under the graphene layer, a second recess formation layer for forming the second recess, and recessing a side portion of the second recess formation layer.

(Supplementary Note 14)
The manufacturing method according to Supplementary Note 13, further including recessing the side portion of the second recess formation layer through second chemical etching.

(Supplementary Note 15)
The manufacturing method according to Supplementary Note 13 or 14, wherein the second recess formation layer is a chemical compound containing Al, Ga, and As.

(Supplementary Note 16)
The manufacturing method according to any one of Supplementary Notes 1 to 15, further including: using, as a mask, a part of the graphene layer left on the element portion after the cutting-off; and subjecting a surface on a side of the part of the element portion to etching, the surface being prevented from being in contact with the part.

(Supplementary Note 17)
The manufacturing method according to Supplementary Note 16, wherein the part is a graphene piece.

(Supplementary Note 18)
The manufacturing method according to Supplementary Note 16 or 17, wherein the etching is chemical etching.

(Supplementary Note 19)
The manufacturing method according to any one of Supplementary Notes 16 to 18, further including forming an irregular structure on a surface of the side of the part through the etching.

(Supplementary Note 20)
The manufacturing method according to any one of Supplementary Notes 1 to 19, wherein the element portion includes a function layer being a layer for the element portion to exert a predetermined function.

(Supplementary Note 21)

The manufacturing method according to Supplementary Note 20, wherein the function layer is an optical device layer.

(Supplementary Note 22)

The manufacturing method according to Supplementary Note 20 or 21, wherein the function is conversion of received light into electricity.

(Supplementary Note 23)

The manufacturing method according to Supplementary Note 22, wherein the light is infrared ray.

(Supplementary Note 24)

The manufacturing method according to any one of Supplementary Notes 20 to 23, further including removing a sacrifice layer after the cutting-off, the sacrifice layer being formed on the function layer and being to be removed.

(Supplementary Note 25)

The manufacturing method according to any one of Supplementary Notes 20 to 24, further including performing the cutting-off after joining the function layer to a second substrate portion.

(Supplementary Note 26)

The manufacturing method according to Supplementary Note 25, wherein the second substrate portion includes metal bumps exposed to a surface, the function layer includes function portions subjected to patterning, and each of the function portions is joined to each of the metal bumps exposed to the surface of the second substrate portion.

(Supplementary Note 27)

The manufacturing method according to Supplementary Note 26, wherein the semiconductor element is a hybrid type semiconductor element.

(Supplementary Note 28)

A semiconductor element, including:

a function layer being formed on a substrate portion and being formed of a semiconductor; and a graphene piece being formed on the function layer directly or through intermediation of a semiconductor layer, wherein the function layer is a layer for exerting a predetermined function.

(Supplementary Note 29)

The semiconductor element according to Supplementary Note 28, wherein the function is conversion of received light into electricity.

(Supplementary Note 30)

The semiconductor element according to Supplementary Note 28 or 29, wherein the semiconductor element is manufactured by a manufacturing method including:

forming a graphene layer on the substrate portion;

forming an element portion on the graphene layer, the element portion including a semiconductor layer directly formed on the graphene layer, which takes over crystal information relating to the substrate portion when the semiconductor layer is formed on the substrate portion without intermediation of the graphene layer; and performing cutting-off between the substrate portion and the element portion at the graphene layer, and the graphene piece is a part of the graphene layer.

(Supplementary Note 31)

The semiconductor element according to any one of Supplementary Notes 28 to 30, wherein irregularities are formed on a surface of a side on which the graphene piece is formed.

Note that, for example, the substrate portion described in Supplementary Notes is equivalent to the substrate portion in FIG. 2 or FIG. 32, or the substrate portion 11 in FIG. 3, FIG. 4, FIGS. 8 to 14, FIGS. 18 to 27, or FIG. 29. Further, for example, the graphene layer is equivalent to the graphene layer in FIG. 2 or FIG. 32, or the graphene layer 3 in FIGS. 6 to 12, FIGS. 18 to 20, FIG. 22, FIG. 23, FIGS. 25 to 27, or FIG. 29.

Further, for example, the element portion is equivalent to the element portion in FIG. 2 or FIG. 32, or the element portion 12 described in FIGS. 11 to 14, FIGS. 18 to 23, FIG. 27, or FIGS. 29 to 31. Further, for example, the cutting-off is equivalent to the cutting-off of A105 in FIG. 2. Further, for example, the first semiconductor layer is equivalent to the first semiconductor layer 2 in FIG. 3, FIG. 4, FIG. 8, FIG. 9, FIGS. 11 to 13, or FIGS. 18 to 23.

Further, for example, the second semiconductor layer is equivalent to the second semiconductor layer 4 in FIGS. 11 to 13, or FIGS. 15 to 23. Further, for example, the first recess is equivalent to the first recess 91 in FIGS. 19 to 21. Further, for example, the first recess formation layer is equivalent to the first recess formation layer 31 described in FIGS. 18 to 21, FIG. 23, FIG. 26, FIG. 27, FIG. 29, or FIG. 30.

Further, for example, the second recess is equivalent to the second recess 92 in FIG. 22 or FIG. 23. Further, for example, the second recess formation layer is equivalent to the second recess formation layer 32 in FIG. 22 or FIG. 23. Further, for example, the irregularities are equivalent to the irregularities on the surface of the second semiconductor layer 4 in FIG. 16 or FIG. 17. Further, for example, the function layer is equivalent to the function layer 5 in FIGS. 11 to 13, FIGS. 17 to 23, or FIG. 26.

Further, for example, the sacrifice layer is equivalent to the sacrifice layer 212 in FIG. 26, FIG. 27, FIG. 29, or FIG. 30. Further, for example, the second substrate portion is equivalent to the second substrate portion 9 in FIGS. 12 to 14, FIG. 20, FIG. 21, or FIGS. 28 to 31. Further, for example, the metal bump is equivalent to the metal bumps 130 in FIGS. 28 to 31. Further, for example, the function portions are equivalent to function portions 5a in FIG. 27 or FIGS. 29 to 31.

Further, for example, the hybrid type semiconductor element is equivalent to the hybrid type semiconductor element 100 in FIG. 31. Further, for example, the graphene piece is equivalent to the graphene pieces 93 in FIG. 15 or FIG. 16.

REFERENCE SIGNS LIST

1 First substrate
2 First semiconductor layer
3 Graphene layer
3a Transfer graphene layer structure body
4 Second semiconductor layer
5 Function layer
5a Function portion
6 First function layer
7 Second function layer
8 Third function layer
11 Substrate portion
12 Element portion
13 PMMA layer
14 Hydrochloric acid solution
31 First recess formation layer
32 Second recess formation layer
51 Copper foil substrate
61 Second graphene layer
62 Third graphene layer 90 Container
91 First recess
92 Second recess
93 Graphene piece
100 Hybrid type semiconductor element
120 Substrate
130 Metal bump
140 Underfill
212 Sacrifice layer
213 Light receiving layer The previous description of embodiments is provided to enable a person skilled in the art to make and use the present invention. Moreover, various modifications to these example embodiments will be readily apparent to those skilled in the art, and the generic principles and specific examples defined herein may be applied to other embodiments without the use of inventive faculty. Therefore, the present invention is not intended to be limited to the example embodiments described herein but is to be accorded the widest scope as defined by the limitations of the claims and equivalents.

Further, it is noted that the inventor's intent is to retain all equivalents of the claimed invention even if the claims are amended during prosecution.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

The invention claimed is:

1. A manufacturing method for a semiconductor element, comprising:
    forming a graphene layer on a substrate portion formed of a semiconductor;
    forming an element portion on the graphene layer which is one atomic layer, the element portion including a semiconductor layer directly formed on the graphene layer, the substrate portion and the element portion being a semiconductor material with a given crystal lattice;
    forming a recess on a side portion of the substrate portion under a state of being held in contact with the graphene layer; and
    performing cutting-off after forming a second recess between the substrate portion and the element portion at the graphene layer.

2. The manufacturing method according to claim 1, wherein the substrate portion includes a first semiconductor layer formed on a first substrate being a semiconductor substrate, and the graphene layer is formed on the first semiconductor layer.

3. The manufacturing method according to claim 2, wherein the first semiconductor layer is a chemical compound containing Ga and As.

4. The manufacturing method according to claim 1, further comprising forming a second semiconductor layer in contact with the graphene layer when the element portion is formed.

5. The manufacturing method according to claim 4, wherein the second semiconductor layer is a chemical compound containing Ga and As.

6. The manufacturing method according to claim 1, further comprising:
    forming the second recess on a side portion of the element portion under a state of being held in contact with the graphene layer; and
    performing the cutting-off after forming the second recess.

7. The manufacturing method according to claim 6, wherein the second recess is formed by forming, on the graphene layer, a second recess formation layer for forming the second recess and recessing a side portion of the second recess formation layer.

8. The manufacturing method according to claim 7, wherein the side portion of the second recess formation layer is recessed through first chemical etching.

9. The manufacturing method according to claim 7, wherein the second recess formation layer is a chemical compound containing Al, Ga, and As.

10. The manufacturing method according to claim 1, wherein the recess is formed by forming, under the graphene layer, a recess formation layer for forming the recess, and recessing a side portion of the recess formation layer.

11. The manufacturing method according to claim 10, wherein the side portion of the recess formation layer is recessed through chemical etching.

12. The manufacturing method according to claim 10, wherein the recess formation layer is a chemical compound containing Al, Ga, and As.

13. The manufacturing method according to claim 1, further comprising:
    using, as a mask, a part of the graphene layer left on the element portion after the cutting-off; and
    subjecting a surface on a side of the part of the element portion to etching, the surface being prevented from being in contact with the part.

14. The manufacturing method according to claim 13, wherein the part is a graphene piece.

* * * * *